United States Patent
Lee

(10) Patent No.: US 9,142,735 B2
(45) Date of Patent: Sep. 22, 2015

(54) LIGHT EMITTING DEVICE

(71) Applicant: LG INNOTEK CO., LTD., Seoul (KR)

(72) Inventor: Gun Kyo Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 7 days.

(21) Appl. No.: 13/830,105

(22) Filed: Mar. 14, 2013

(65) Prior Publication Data
US 2014/0077242 A1  Mar. 20, 2014

(30) Foreign Application Priority Data
Sep. 20, 2012 (KR) .................. 10-2012-0104637

(51) Int. Cl.
| | |
|---|---|
| H01L 33/50 | (2010.01) |
| H01L 33/38 | (2010.01) |
| H01L 33/60 | (2010.01) |
| H01L 33/40 | (2010.01) |
| H01L 33/42 | (2010.01) |

(52) U.S. Cl.
CPC .............. *H01L 33/505* (2013.01); *H01L 33/38* (2013.01); *H01L 33/405* (2013.01); *H01L 33/42* (2013.01); *H01L 33/507* (2013.01); *H01L 33/60* (2013.01); *H01L 2224/48091* (2013.01); *H01L 2924/12032* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 7,078,737 B2* | 7/2006 | Yuri et al. .................. | 257/99 |
| 2004/0021143 A1* | 2/2004 | Stockman .................. | 257/79 |
| 2007/0164308 A1* | 7/2007 | Yoshimura et al. ......... | 257/103 |
| 2010/0075493 A1* | 3/2010 | Ishikawa et al. ............ | 438/613 |
| 2012/0074446 A1* | 3/2012 | Choi ........................ | 257/98 |
| 2012/0138986 A1* | 6/2012 | Chung et al. ............... | 257/98 |

FOREIGN PATENT DOCUMENTS

| | | |
|---|---|---|
| JP | 2001-203386 A | 7/2001 |
| JP | 2004-172578 A | 6/2004 |
| JP | 2005-136399 A | 5/2005 |
| JP | 2007-116158 A | 5/2007 |
| JP | 2008-166740 A | 7/2008 |

\* cited by examiner

*Primary Examiner* — Daniel Luke
(74) *Attorney, Agent, or Firm* — Birch, Stewart, Kolasch & Birch, LLP

(57) ABSTRACT

Disclosed is a light emitting device including a light emitting structure comprising a first semiconductor layer, an active layer and a second semiconductor layer, a phosphor plate disposed on the second semiconductor layer, and a bonding portion disposed between the light emitting structure and the phosphor plate, the bonding portion bonding the phosphor plate to the light emitting structure.

19 Claims, 17 Drawing Sheets

LIGHT EMITTING DEVICE

CROSS REFERENCE TO RELATED APPLICATION

This application claims priority under 35 U.S.C. §119 to Korean Patent Application No. 10-2012-0104637, filed in Korea on Sep. 20, 2012, which is hereby incorporated in its entirety by reference as if fully set forth herein.

TECHNICAL FIELD

Embodiments relate to a light emitting device.

BACKGROUND

Light emitting devices such as light emitting diodes (LEDs) or laser diodes (LDs) using Group III-V or II-VI compound semiconductor materials render a variety of colors such as red, green, blue and ultraviolet rays in accordance with development of thin film growth methods and device materials. Light emitting devices efficiently realize white rays using fluorescent materials or combining colors, and have advantages such as low power consumption, semi-permanent lifespan, high response speed, stability and eco-friendliness, as compared to conventional light sources such as fluorescent lamps and incandescent lamps.

In general, a resin composition comprising a mixture of a phosphor and a resin is applied to light emitting chips, or the light emitting chips are sealed with a resin composition in order to produce white light. In addition, instead of a method of coating or molding a resin containing a phosphor, a method of disposing layers, sheets or plates containing phosphors on light emitting chips may be used. In this case, it is important to stably adhere phosphor layers, phosphor sheets or phosphor plates to upper parts of light emitting chips.

SUMMARY

Embodiments provide a light emitting device to improve adhesion accuracy of phosphor plates and prevent discoloration and cracks of the phosphor plates caused by heat.

In one embodiment, a light emitting device includes a light emitting structure comprising a first semiconductor layer, an active layer and a second semiconductor layer, a phosphor plate disposed on the second semiconductor layer, and a bonding portion disposed between the light emitting structure and the phosphor plate, the bonding portion bonding the phosphor plate to the light emitting structure.

The bonding portion may include a first bonding layer disposed on the second semiconductor layer, and a second bonding layer disposed on a surface of the phosphor plate and being bonded to the first bonding layer.

The second bonding layer may be fused to the first bonding layer. A fused interface may be present between the first bonding layer and the second bonding layer.

A melting point of the second bonding layer may be different from that of the first bonding layer.

The first bonding layer and the second bonding layer may include a plurality of first bonding layers and a plurality of second bonding layers, respectively, the first bonding layers and the second bonding layers may be disposed such that the first bonding layers correspond to the second bonding layers, respectively, and one of the second bonding layers may be bonded to one of the first bonding layers.

The light emitting device may further include a pad portion for wire bonding disposed on the second semiconductor layer, wherein the phosphor plate has an opening exposing the pad portion.

The first bonding layer and the second bonding layer may include at least one of Ag, Ni, Cr, Ti, Al, Rh, Pd, Sn, Ru, Mg, Zn, Pt and Au, or an alloy containing the same.

The light emitting device may further include an extension electrode portion extending from the pad portion and being disposed on the second semiconductor layer.

The extension electrode portion may be disposed between the second semiconductor layer and the phosphor plate, and the opening may expose a part of the extension electrode portion adjacent to the pad portion.

The bonding portion may further include a third bonding layer disposed on a surface of the phosphor plate and bonded to the extension electrode portion.

A fused interface may be present between the extension electrode portion and the third bonding layer.

A melting point of the third bonding layer may be different from that of the extension electrode portion.

A width of the third bonding layer may be smaller than or equivalent to that of the extension electrode portion.

An air void (gap) may be present between the phosphor plate and the light emitting structure.

The light emitting device may further include a substrate disposed under the first semiconductor layer, a first electrode disposed on an exposed part of the first semiconductor layer, and a conductive layer disposed on the second semiconductor layer, wherein the first bonding layer is disposed on the conductive layer.

The light emitting device may further include a reflective layer disposed under the first semiconductor layer, an ohmic region disposed between the first semiconductor layer and the reflective layer, and a support layer disposed under the reflective layer.

The light emitting device may further include a first electrode portion disposed under the first semiconductor layer, a second electrode portion disposed under the first electrode portion, the second electrode portion passing through the first electrode portion, the first semiconductor layer and the active layer, and contacting the second semiconductor layer, and an insulating layer disposed between the first electrode portion and the second electrode portion, between the first semiconductor layer and the second electrode portion, and between the active layer and the second electrode portion.

The second electrode portion may include a lower electrode layer disposed under the first electrode portion, and at least one contact electrode branching from the lower electrode layer and contacting the second semiconductor layer.

In another embodiment, a light emitting device package includes a package body, a first lead frame and a second lead frame disposed on the package body, a light emitting device disposed on the second lead frame, and a resin layer surrounding the light emitting device, wherein the light emitting device includes a light emitting structure comprising a first semiconductor layer, an active layer and a second semiconductor layer, a phosphor plate disposed on the second semiconductor layer, and a bonding portion disposed between the light emitting structure and the phosphor plate, the bonding portion bonding the phosphor plate to the light emitting structure.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
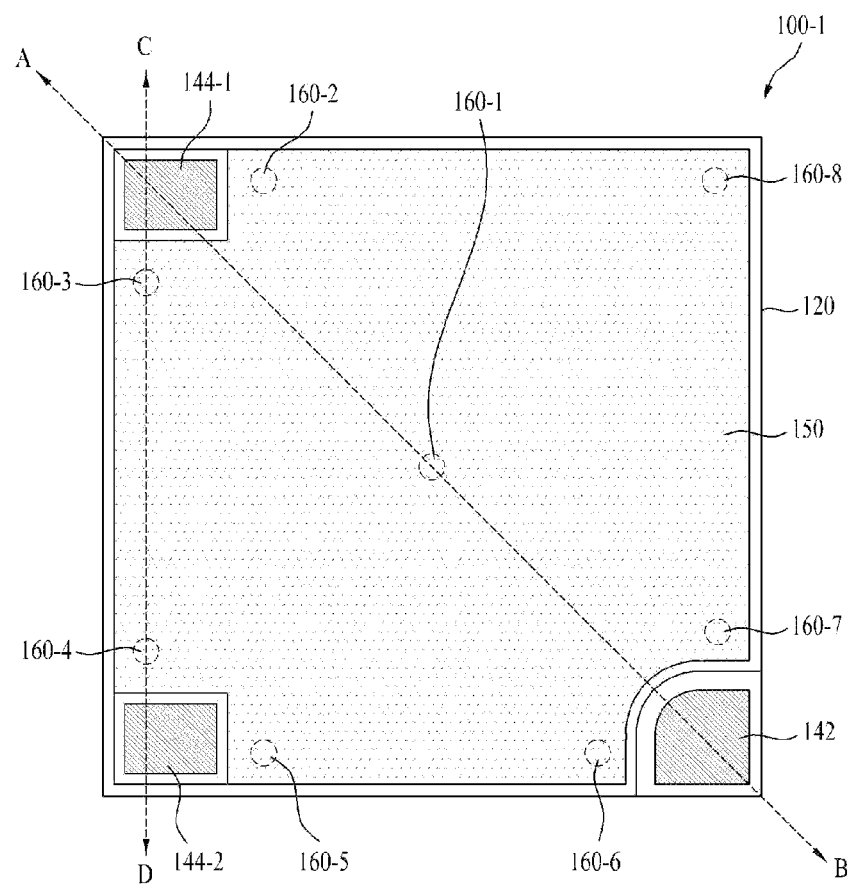
FIG. 1 is a plan view illustrating a light emitting device according to one embodiment.

Hereinafter, embodiments will be clearly understood from the description taken in conjunction with the annexed drawings and the embodiments.

Prior to description of the embodiments, with regard to description of preferred embodiments, it will be understood that, when one element such as a layer (film), a region or a structure is referred to as being formed "on" or "under" another element such as a substrate, a layer (film), a region, a pad or a pattern, the one element may be directly formed "on" or "under" the another element, or be indirectly formed "on" or "under" the another element via an intervening element present therebetween. When an element is referred to as being 'on' or 'under', 'under the element' as well as 'on the element' can be included based on the element.

In the drawings, the thickness or size of each layer is exaggerated, omitted, or schematically illustrated for convenience of description and clarity. Also, the size or area of each constituent element does not entirely reflect the actual size thereof.

Figure 2:
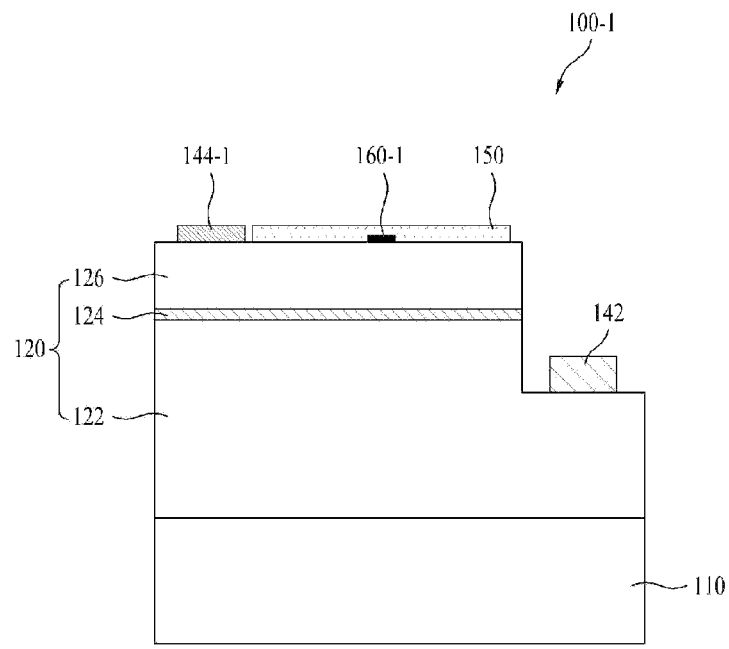
FIG. 2 is a sectional view taken along the direction AB of the light emitting device shown in FIG. 1.
Figure 3:
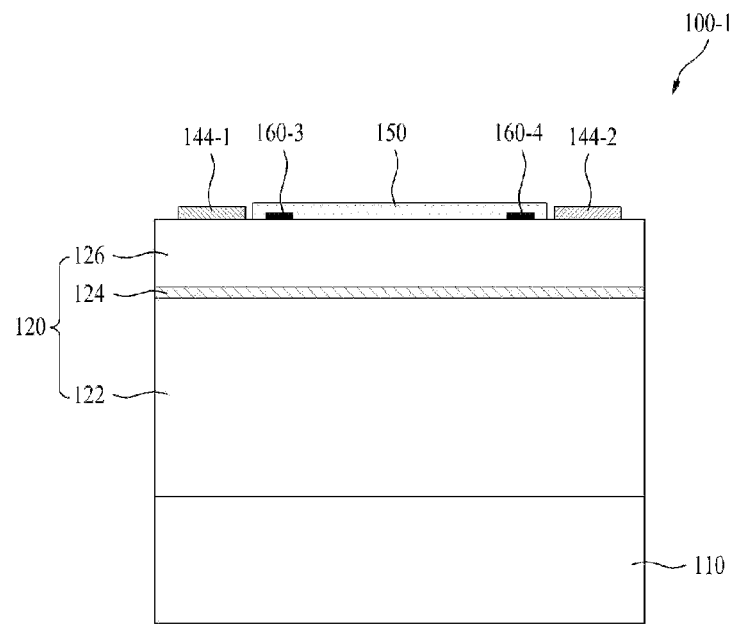
FIG. 3 is a sectional view taken along the direction CD of the light emitting device shown in FIG. 1.
Figure 4:
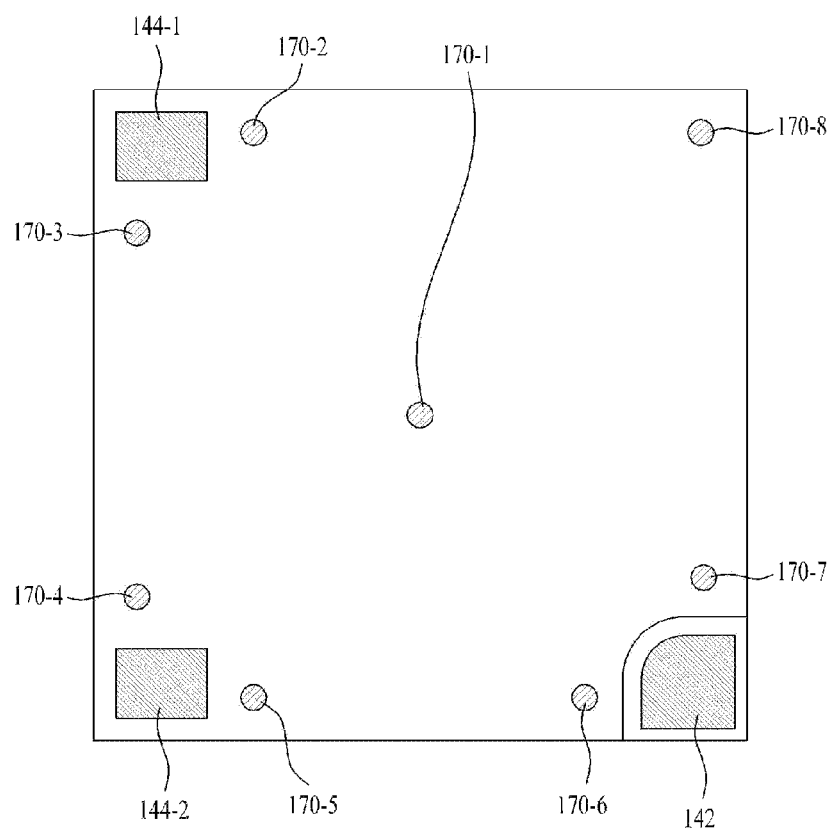
FIG. 4 illustrates a first bonding layer of a bonding portion shown in FIG. 1.
Figure 5:
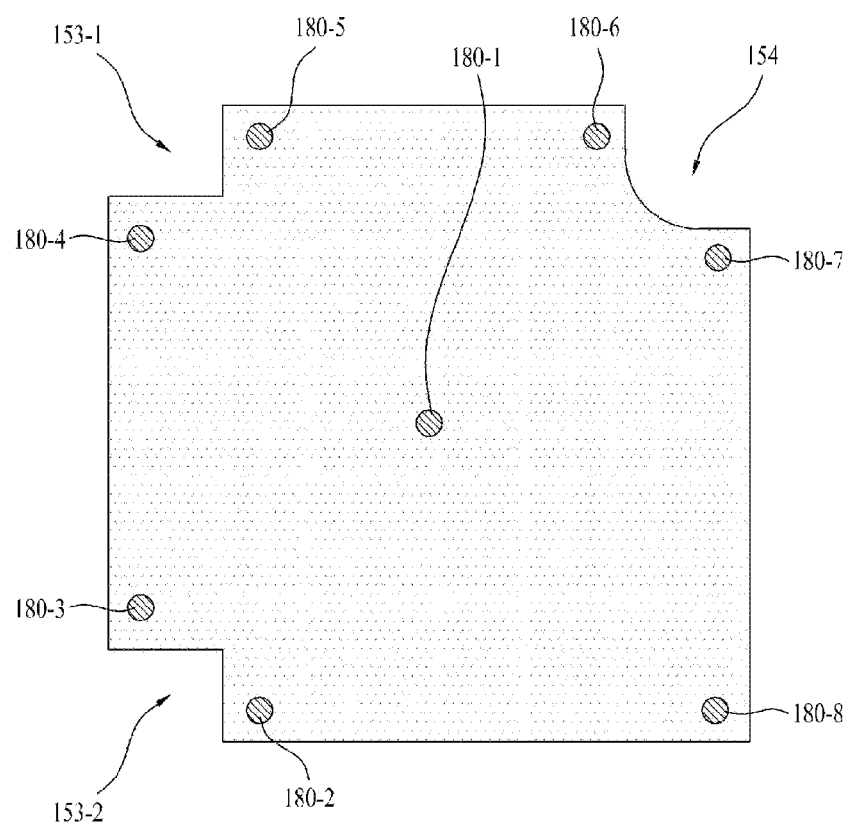
FIG. 5 illustrates a second bonding layer of a bonding portion shown in FIG. 1.

FIG. 1 is a plan view illustrating a light emitting device 100-1 according to one embodiment. FIG. 2 is a sectional view taken along the direction AB of the light emitting device 100-1 shown in FIG. 1. FIG. 3 is a sectional view taken along the direction CD of the light emitting device 100-1 shown in FIG. 1. FIG. 4 illustrates first bonding layers 170-1 to 170-$n$ of bonding portions 160-1 to 160-$n$ shown in FIG. 1. FIG. 5 illustrates second bonding layers 180-1 to 180-$n$ of bonding portions 160-1 to 160-$n$ shown in FIG. 1.

Referring to FIGS. 1 to 5, the light emitting device 100-1 includes a substrate 110, a light emitting structure 120, a first electrode 142, second electrodes 144-1 and 144-2, at least one bonding portion 160-1 to 160-$n$ (in which n is a natural number of 1 or more) including at least one first bonding layer 170-1 to 170-$n$ (in which n is a natural number of 1 or more) and at least one second bonding layer 180-1 to 180-$n$ (in which n is a natural number of 1 or more), and a phosphor plate 150.

The substrate 110 supports the light emitting structure 120. The substrate 110 may be formed of a material suitable for development of semiconductor materials. In addition, the substrate 110 may be formed of a material with high thermal conductivity and may be a conductive substrate or an insulating substrate.

For example, the substrate 110 may be sapphire ($Al_2O_3$) or a material including at least one of GaN, SiC, ZnO, Si, GaP, InP, $Ga_2O_3$ and GaAs. The substrate 110 may have roughness or unevenness on an upper surface to improve light extraction.

In order to reduce lattice mismatch caused by difference in lattice constant between the substrate 110 and the light emitting structure 120, a buffer layer (not shown) may be disposed between the first semiconductor layer 122 and the substrate 110. The buffer layer may be a nitride semiconductor including Group III and V elements.

For example, the buffer layer may include at least one of InAlGaN, GaN, AlN, AlGaN and InGaN. The buffer layer may have a single layer structure or a multi-layer structure and may be doped with a Group II element or Group IV element as an impurity.

In addition, in order to improve crystallinity of the first semiconductor layer 122, an undoped semiconductor layer (not shown) may be interposed between the substrate 110 and the light emitting structure 120. The undoped semiconductor layer has the same properties as the first semiconductor layer, except that the undoped semiconductor layer has a low electrical conductivity, as compared to the first semiconductor layer 122, since the undoped semiconductor layer is not doped with an n-type dopant.

The light emitting structure 120 is disposed on the substrate 110 and emits light. The light emitting structure 120 may expose a part of the first semiconductor layer 122. For example, the part of the first semiconductor layer 122 may be exposed by partially etching the second semiconductor layer 126, the active layer 124 and the first semiconductor layer 122.

The first semiconductor layer 122 may be disposed on the substrate 110 and may be a nitride semiconductor layer.

For example, the first semiconductor layer 122 may be selected from semiconductor materials having a compositional formula of $In_xAl_yGa_{(1-x-y)}N$ (0≤x≤1, 0≤y≤1, 0≤x+y≤1), such as GaN, AlN, AlGaN, InGaN, InN, InAlGaN and AlInN, and may be doped with an n-type dopant such as Si, Ge, Sn, Se or Te.

The active layer 124 may be disposed between the first semiconductor layer 122 and the second semiconductor layer 126. The active layer 124 generates light based on energy generated in the process of recombination of electrons supplied from the first semiconductor layer 122 and holes supplied from the second semiconductor layer 126.

The active layer 124 may be a semiconductor having a compositional formula of $In_xAl_yGa_{1-x-y}N$ (0≤x≤1, 0≤y≤1, 0≤x+y≤1) and the active layer 124 may have a quantum well structure including at least one quantum well layer and at least one quantum barrier layer which alternate with each other. For example, the active layer 124 may have a multi quantum well (MQW) structure. An energy band gap of the quantum barrier layer may be greater than that of the quantum well layer.

The second semiconductor layer 126 may be disposed on the active layer 124 and may be a nitride semiconductor layer. The second semiconductor layer 126 may be selected from semiconductor materials having a compositional formula of $In_xAl_yGa_{1-x-y}N$ (0≤x≤1, 0≤y≤1, 0≤x+y≤1), for example, GaN, AlN, AlGaN, InGaN, InN, InAlGaN and AlInN, and may be doped with a p-type dopant such as Mg, Zn, Ca, Sr or Ba.

The first electrode 142 is disposed on the exposed first semiconductor layer 122 and the second electrodes 144-1 and 144-2 may be disposed on the second semiconductor layer 126.

The first electrode 142 and the second electrodes 144-1 and 144-2 may include a conductive material, for example, at least one of Pb, Sn, Au, Ge, Bi, Cd, Zn, Ag, Ni, Ti, Cu, Al, Ir, In, Mg, Pt or Pd, or an alloy thereof, and have a single or multiple layer structure.

The first electrode 142 and the second electrodes 144-1, 144-2 shown in FIG. 1 may be electrode pads, to which wires to receive power are bonded, but the disclosure is not limited thereto.

The phosphor plate 150 is disposed on the light emitting structure 120, for example, on the second semiconductor layer 126. The phosphor plate 150 transforms a wavelength of light emitted from the light emitting structure 120.

The phosphor plate 150 may be a mixture of a phosphor and a resin. The resin mixed with the phosphor may be a transparent thermosetting resin having a high hardness and superior reliability and examples thereof include a silicone resin, an epoxy resin, glass, glass ceramic, a polyester resin, an acrylic resin, an urethane resin, a nylon resin, a polyamide resin, a polyimide resin, a vinyl chloride resin, a polycarbonate resin, a polyethylene resin, a Teflon resin, a polystyrene resin, a polypropylene resin, a polyolefin resin and the like. Preferably, the phosphor plate 150 is polycarbonate, glass or glass ceramic.

The phosphor mixed with the resin may include one or more types of phosphors. The phosphor plate 150 may include at least one of a silicate phosphor, a YAG phosphor and a nitride phosphor. For example, the silicate phosphor may be $Ca_2SiO_4$:Eu, $Sr_2SiO_4$:Eu, $Sr_3SiO_5$:Eu, $Ba_2SiO_4$:Eu, or $(Ca, Sr, Ba)_2SiO_4$:Eu), the YAG phosphor may be $Y_3Al_5O_{12}$:Ce, $(Y,Gd)_3Al_5O_{12}$:Ce), and the nitride phosphor may be $Ca_2Si_5N_8$:Eu, $CaAlSiN_2$:Eu, $(Sr, Ca)AlSiN_2$:Eu, or $\alpha,\beta$-SiAlON:Eu.

The phosphor plate may be manufactured by press-molding the mixture of the resin and the phosphor in the form of a slurry using a mold, but the disclosure is not limited thereto.

The formation of the phosphor plate may be carried out by a method of extruding the mixture of the resin and the phosphor in the form of a slurry from an extruder, a so-called "extrusion molding". Alternatively, the formation of the phosphor plate may be carried out by a method in which the mixture of the resin and the phosphor is poured on the bottom and a blade designed to be spaced from the bottom by a predetermined distance is passed over the mixture, a so-called "doctor blade method".

The preliminary phosphor plate thus manufactured may be cut to a desired size and shape by a sawing or scribing process to form the phosphor plate 150.

The phosphor plate 150 may be provided with at least one opening 153-1 or 153-2 exposing the second electrodes 144-1 and 144-2 for wire bonding. An upper surface of the second electrodes 144-1 and 144-2 may be exposed through the opening 153-1 or 153-2 and the wire is easily bonded to the exposed upper surface of the second electrodes 144-1 and 144-2.

The shape of the opening 153-1 or 153-2 may be changed according to the position and shape of the second electrodes 144-1 and 144-2. For example, when the second electrodes 144-1 and 144-2 are disposed near an edge of the second semiconductor layer 126, the opening 153-1 or 153-2 has a shape formed by cutting an edge of the phosphor plate 150, as shown in FIG. 5.

Since the number of the second electrodes 144-1 and 144-2 is two, the phosphor plate 150 has a shape, left two edges of which are removed, as shown in FIG. 5, but the disclosure is not limited thereto. The opening may have various shapes according to the number and position of the second electrodes. For example, in another embodiment, the opening may pass through the phosphor plate 150.

In addition, the shape of the phosphor plate 150 may depend on the shape of the light emitting structure 120. For example, in order to expose the first electrode 142, the light emitting structure 120 may have removed portions and the phosphor plate 150 may have an opening 154 which corresponds to the shape of one portion of the light emitting structure 120 exposing the first electrode 142. The opening 154 may be required for wire bonding to the first electrode 142.

The bonding portion 160-1 to 160-$n$ (in which n is a natural number of 1 or more) is interposed between the phosphor plate 150 and the light emitting structure 120, for example, the second semiconductor layer 126, and adheres or fixes the phosphor plate 150 to the light emitting structure, for example, the second semiconductor layer 126. The bonding portion 160-1 to 160-$n$ (in which n is a natural number of 1 or more) may be provided in plural and the plurality of bonding portions 160-1 to 160-$n$ (in which n is a natural number higher than 1) may be spaced from one another.

The bonding portion 160-1 to 160-$n$ (in which n is a natural number of 1 or more) includes the first bonding layer 170-1 to 170-$n$ (in which n is a natural number of 1 or more) and the second bonding layer 180-1 to 180-$n$ (in which n is a natural number of 1 or more) which are adhered to each other.

The first bonding layer 170-1 to 170-$n$ (in which n is a natural number of 1 or more) is disposed on the second semiconductor layer 126 and the second bonding layer 180-1 to 180-$n$ is disposed on a surface (for example, lower surface 151) of the phosphor plate 150.

The first bonding layer 170-1 to 170-$n$ (in which n is a natural number of 1 or more) may be provided in plural and the plurality of first bonding layers 170-1 to 170-$n$ (for example, n=8) may be spaced from one another on the second semiconductor layer 126.

For example, the first bonding layer 170-1 to 170-n (in which n is a natural number of 1 or more) may be formed by depositing a metal material on the second semiconductor layer 126 and patterning the deposited metal material by photolithography and etching processes. The first bonding layer 170-1 to 170-n (in which n is a natural number of 1 or more) may be spaced from the second electrodes 144-1 and 144-2 to which power is supplied.

The second bonding layer 180-1 to 180-n (in which n is a natural number of 1 or more) may be provided in plural and the plurality of second bonding layers 180-1 to 180-n (for example, n=8) may be spaced from one another on a surface 151 (for example, lower surface) of the phosphor plate 150. The surface 151 of the phosphor plate 150 may face an upper surface of the second semiconductor layer 126.

For example, the second bonding layer 180-1 to 180-n (in which n is a natural number of 1 or more) may be formed by depositing a metal material on the surface 151 of the phosphor plate 150 and patterning the deposited metal material by photolithography and etching processes.

Horizontal cross-sections of the first bonding layer 170-1 to 170-n (in which n is a natural number of 1 or more) and the second bonding layer 180-1 to 180-n (in which n is a natural number of 1 or more) may have a variety of shapes such as circular, oval or polygonal shapes.

In order to effectively adhere or fix the phosphor plate 150 to the second semiconductor layer 126, the first bonding layers 170-1 to 170-n (for example n=8) are disposed in the center of the second semiconductor layer 126 and near an edge of the second semiconductor layer 126. In addition, when the second electrodes 144-1 and 144-2 are disposed near an edge of the second semiconductor layer 126, the first bonding layers (for example, 170-2, 170-3, 170-4 and 170-5) may be disposed near the second electrodes 144-1 and 144-2.

The second bonding layers 180-1 to 180-n (for example n=8) may be disposed or arranged on a surface of the phosphor plate 150 such that they correspond to the first bonding layers 170-1 to 170-n (for example, n=8), respectively. For example, the second bonding layers 180-1 to 180-n (for example, n=8) may be disposed in the center of the phosphor Plate 150 and near an edge of the phosphor plate 150.

One of the second bonding layers 180-1 to 180-n (for example, n=8) may be bonded to the corresponding one of the first bonding layers 170-1 to 170-n (for example, n=8), the first bonding layer 170-1 to 170-n (in which n is a natural number of 1 or more) and the second bonding layer 180-1 to 180-n (in which n is a natural number of 1 or more) which are bonded to each other may constitute the bonding portion (160-1 to 160-n, n≥1). The first bonding layer 170-1 to 170-n (for example, n=8) and the second bonding layer 180-1 to 180-n (for example, n=8) may be bonded to each other by eutectic bonding.

Figure 8:
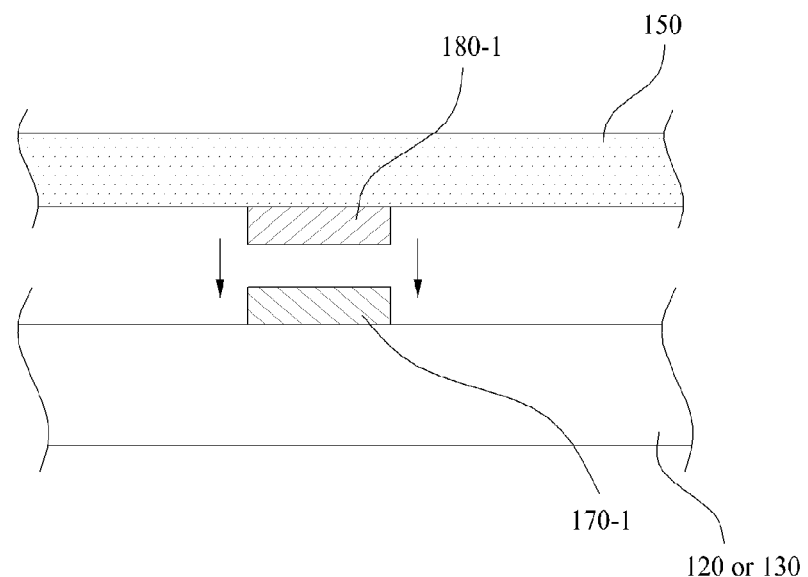
FIG. 8 illustrates fusing of the first bonding layer to the second bonding layer.
Figure 9:
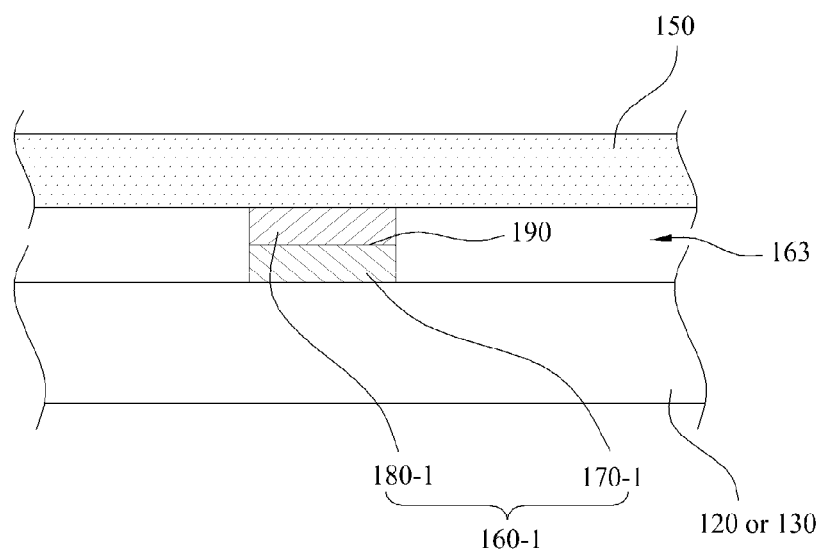
FIG. 9 illustrates the second bonding layer fused to the first bonding layer.

FIG. 8 illustrates fusing of the first bonding layer 170-1 to the second bonding layer 180-1 and FIG. 9 illustrates the second bonding layer 180-1 fused to the first bonding layer 170-1.

Referring to FIGS. 8 and 9, the first bonding layer (for example, 170-1) and the second bonding layer (for example, 180-1) may be bonded to each other, and a fused interface 190 may be present between the first bonding layer (for example, 170-1) and the second bonding layer (for example, 180-1).

The first bonding layer 170-1 to 170-n (n≥1) may include a metal material, for example, at least one of Ag, Ni, Cr, Ti, Al, Rh, Pd, Sn, Ru, Mg, Zn, Pt, and Au, or an alloy thereof.

The second bonding layer 180-1 to 180-n (n≥1) may include a metal material, for example, at least one of Ag, Ni, Cr, Ti, Al, Rh, Pd, Sn, Ru, Mg, Zn, Pt and Au, or an alloy thereof. A melting point of the second bonding layer 180-1 to 180-n (for example, n=8) may be different from that of the first bonding layer 170-1 to 170-n (for example, n=8).

For example, the melting point of the second bonding layer 180-1 to 180-n (for example, n=8) may be lower than that of the first bonding layer 170-1 to 170-n (for example, n=8), and the first bonding layer 170-1 to 170-n (for example, n=8) may be Au and the second bonding layer 180-1 to 180-n (for example, n=8) may be AuSn.

The bonding portion 160-1 to 160-n (for example, n=8) may have a structure in which the second bonding layer 180-1 to 180-n (for example, n=8) is adhered to the first bonding layer 170-1 to 170-n (for example, n=8). That is, the bonding portion may have a structure in which the second bonding layer 180-1 to 180-n (for example, n=8) is melted and adhered to the first bonding layer 170-1 to 170-n (for example, n=8).

When the phosphor plate is adhered to the light emitting structure or the conductive layer using an adhesive such as silicone resin, disadvantageously, the adhesive such as silicone resin is vulnerable to high temperatures, thus deteriorating reliability, a separate process (hereinafter, referred to as a "pad exposure process") to expose a pad portion bonded to the wire is required, and adhesion accuracy is deteriorated due to flowability of an adhesive resin.

However, in the present embodiment, as the phosphor plate 150 is adhered to the light emitting structure 120 by metal fusion, reliability is improved due to resistance to high temperatures, adhesion accuracy is improved due to possibility of accurate bonding at an intended position, and the pad exposure process is not required and an overall process is thus simplified, since the shape of the phosphor plate 150 is variable so as to provide an opening exposing a pad portion.

In addition, the surface 151 of the phosphor plate 150 contacts the surface of the second semiconductor layer 126, as shown in FIGS. 2 and 3, but the disclosure is not limited thereto. As shown in FIG. 9, at least one portion of the surface of the phosphor plate 150 may be spaced from the surface of the second semiconductor layer 126 by the bonding portion 160-1 to 160-n (for example, n=8).

An air void (gap) 163 may be present between the phosphor plate 150 and the second semiconductor layer 126 by the bonding portion 160-1 to 160-n (for example, n=8). Although the air void 163 is present, one portion of the surface 151 of the phosphor plate 150 may contact the second semiconductor layer 126.

A difference in index of refraction may be present between the second semiconductor layer 126, the air void 163, and the phosphor plate 150. For this reason, light diffusion and extraction of the light emitting device 100-1 can be improved.

In addition, the bonding portion 160-1 to 160-n (for example, n=8) serves as a passage dissipating heat of the phosphor plate 150. For this reason, in the present embodiment, heat emission efficiency is improved and discoloration and cracks of the phosphor plate 150 caused by heat can thus be prevented.

Figure 6:
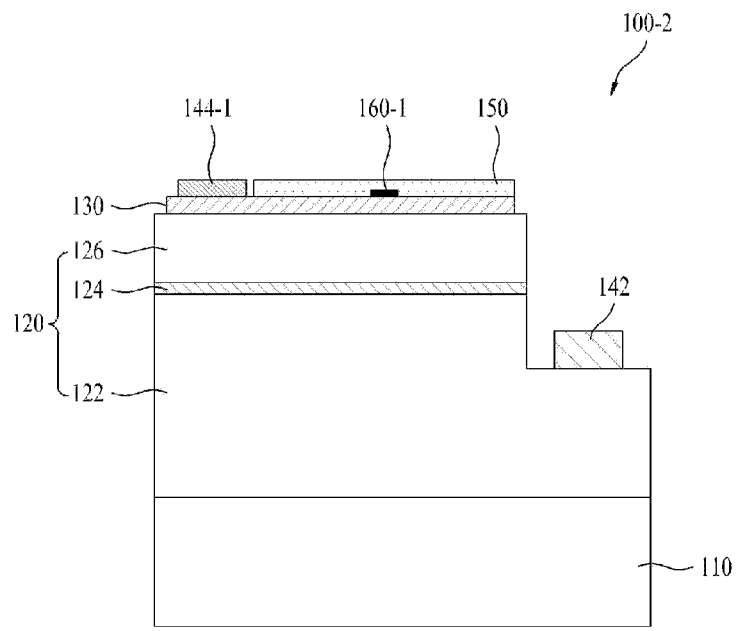
FIG. 6 is a sectional view taken along the direction AB of a varied embodiment of the light emitting device shown in FIG. 1.
Figure 7:
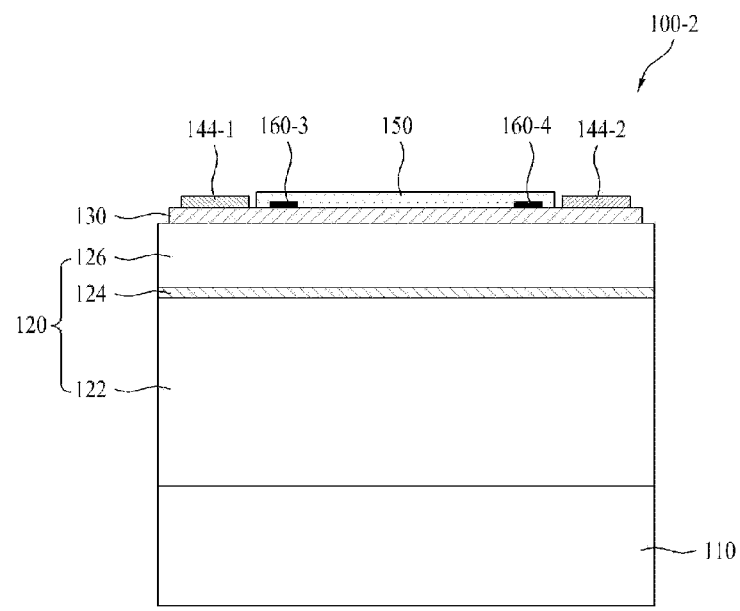
FIG. 7 is a sectional view taken along the direction CD of a varied embodiment of the light emitting device shown in FIG. 6.

FIG. 6 is a sectional view taken along the direction AB of a varied embodiment of the light emitting device 100-2 shown in FIG. 1. FIG. 7 is a sectional view taken along the direction CD of a varied embodiment of the light emitting device 100-2 shown in FIG. 6. The plan view of the light emitting device 100-2 according to the varied embodiment may be the same as in FIG. 1. Identical reference numerals represent like configurations throughout FIGS. 1 to 3 and the contents described above are omitted or described in brief.

Referring to FIGS. 6 and 7, compared with the light emitting device 100-1 shown in FIG. 1, the light emitting device 100-2 according to the varied embodiment may further include a conductive layer 130 disposed on the second semiconductor layer 126.

The conductive layer 130 reduces total reflection and exhibits light transmittance, thus increasing an extraction efficiency of light emitted from the active layer 124 to the second semiconductor layer 126.

The conductive layer 130 may be formed of a material having high electrical conductivity. The conductive layer 130 may have a single or multiple layer structure comprising at least one transparent conductive oxide of, for example, indium tin oxide (ITO), tin oxide (TO), indium zinc oxide IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The second electrodes 144-1 and 144-2 of the light emitting device 100-2 according to the varied embodiment may be disposed on the conductive layer 130. The bonding portion 160-1 to 160-$n$ (in which n is a natural number of 1 or more) of the light emitting device 100-2 according to the varied embodiment may be interposed between the phosphor plate 150 and the conductive layer 130 and adheres or fixes the phosphor plate 150 to the conductive layer 130.

The first bonding layer 170-1 to 170-$n$ (in which n is a natural number of 1 or more) of the light emitting device 100-2 according to the varied embodiment may be disposed on the conductive layer 130. A formation method and materials of the first bonding layer 170-1 to 170-$n$ (in which n is a natural number of 1 or more) and the second bonding layer 180-1 to 180-$n$ (n≥1) of the light emitting device 100-2 according to the varied embodiment, a formation method of the bonding portion 160-1 to 160-$n$ (in which n is a natural number of 1 or more) and the like (see FIGS. 8 and 9) may be the same as described above.

For these reasons, the light emitting device 100-2 according to the varied embodiment is resistant to high temperatures and exhibits improved reliability, improved adhesion accuracy of the phosphor plate 150 and does not require a separate pad exposure process, thus simplifying an overall process.

An air void 163 may be present between the phosphor plate 150 and the conductive layer 130 by the bonding portion (for example, 160-1), as described in FIG. 9.

Although the air void 163 is present, one portion of the surface 151 of the phosphor plate 150 may contact the second semiconductor layer 126. A difference in index of refraction may be present between the second semiconductor layer 126, the air void 163, and the phosphor plate 150. For this reason, light diffusion and extraction of the light emitting device 100-2 can be improved.

Figure 10:
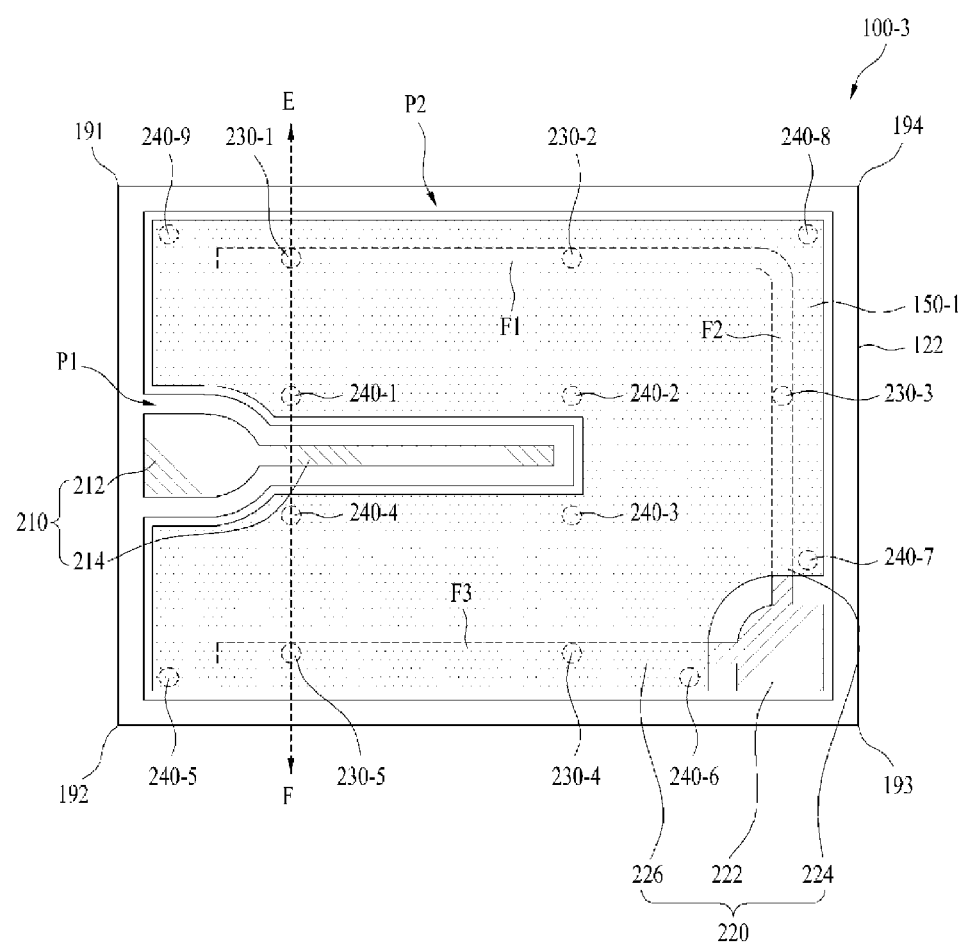
FIG. 10 is a plan view illustrating a light emitting device according to another embodiment.
Figure 11:
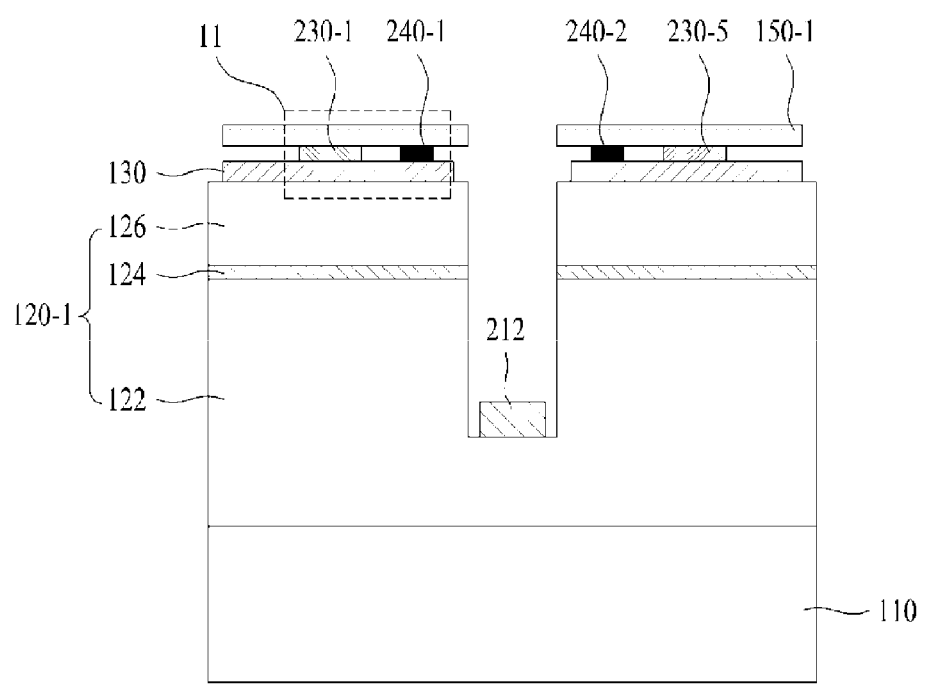
FIG. 11 is a sectional view taken along the direction EF of the light emitting device shown in FIG. 10.

FIG. 10 is a plan view illustrating a light emitting device 100-3 according to another embodiment. FIG. 11 is a sectional view taken along the direction EF of the light emitting device 100-3 shown in FIG. 10. Identical reference numerals represent identical configurations throughout FIGS. 1 to 3 and the contents described above are omitted or described in brief.

Referring to FIGS. 10 and 11, the light emitting device 100-3 includes a substrate 110, a light emitting structure 120-1, a conductive layer 130, a first electrode 210, a second electrode 220, a first bonding portion 240-1 to 240-$m$ (in which m is a natural number of 1 or more), a second bonding portion 230-1 to 230-$n$ (in which n is a natural number of 1 or more), and a phosphor plate 150-1.

Compared with the light emitting device 100-1 according to the embodiment shown in FIG. 1, the light emitting device 100-3 is different from the light emitting device 100-1 in terms of electrode structure and thus shape of the light emitting structure, and further includes a second bonding portion 230-1 to 230-$m$ (in which m is a natural number of 1 or more) to bond the phosphor plate 150-1 to extension electrodes 224 and 226.

An exposed portion P1 of the first semiconductor layer 122 shown in FIG. 10 may be different from that of FIG. 1. For example, the light emitting structure 120 may expose a first portion P1 and a second portion P2 of the first semiconductor layer 122. The first portion P1 may be a region in which the pad portion 212 of the first electrode 210 is disposed and the second portion P2 may be a region in which an extension electrode 214 of the first electrode 210 is disposed.

The first electrode 210 may include a pad portion 212 disposed in the first portion P1 of the first semiconductor layer 122 and an extension electrode 214 disposed in the second portion P2 of the first semiconductor layer 122.

The pad portion 212 may be a region of the first electrode 210 in which a wire is bonded to receive first power. The extension electrode 214 is a remaining region of the first electrode 210 which branches from the pad portion 212 and extends in a first direction. The first direction extends from a first edge 191 of the light emitting structure (for example, the first semiconductor layer 122) toward a fourth edge 194 thereof.

The embodiment shown in FIG. 10 includes one extension electrode 214 which branches from the pad portion 212, but the disclosure is not limited thereto and the number of extension electrodes 214 may be two or more.

The second electrode 220 may include a pad portion 222 and extension electrodes 224 and 226 disposed on the conductive layer 130. In another embodiment, the conductive layer 130 may be omitted. In this case, the pad portion 222 and the extension electrode 224 may be disposed on the second semiconductor layer 126.

The pad portion 222 may be a region of the second electrode 220 in which a wire is bonded to receive second power. The extension electrodes 224 and 226 may be remaining regions of the second electrode 220 which branch from the pad portion 222 and extend. Although two second extension electrodes 224 and 226 are illustrated in FIG. 10, the disclosure is not limited thereto. In another embodiment, the number of extension electrodes of the second electrode may be one or three or more.

For example, one extension electrode 224 may include a first portion F1 which branches from one side of the pad portion 222 and extends in a second direction and a second portion F2 which branches from the first portion F1 and extends in a third direction.

The other extension electrode 226 may include a third part F3 which branches from another side of the pad portion 222 and extends in the third direction. The second direction is a direction which extends from the third edge 193 of the light emitting structure 120, for example, the first semiconductor layer 122 to the fourth edge 194 thereof and the third direction is opposite to the first direction.

In FIG. 10, one extension electrode 224 and the other extension electrode 226 are bilaterally asymmetrical, based on the second electrode pad 222, but in another embodiment, they may be bilaterally symmetrical to each other.

The first bonding portion 240-1 to 240-$n$ (in which n is a natural number of 1 or more) is interposed between the conductive layer 130 and the phosphor plate 150-1 and bonds the phosphor plate 150-1 to the conductive layer 130.

The first bonding portion 240-1 to 240-$n$ (in which n is a natural number of 1 or more) may include a first bonding layer 282-1 to 282-*n* (in which n is a natural number of 1 or more) disposed on the conductive layer 130, and a second bonding layer 284-1 to 284-*n* (in which n is a natural number of 1 or more) disposed on a surface of the phosphor plate 150-1.

Figure 12:
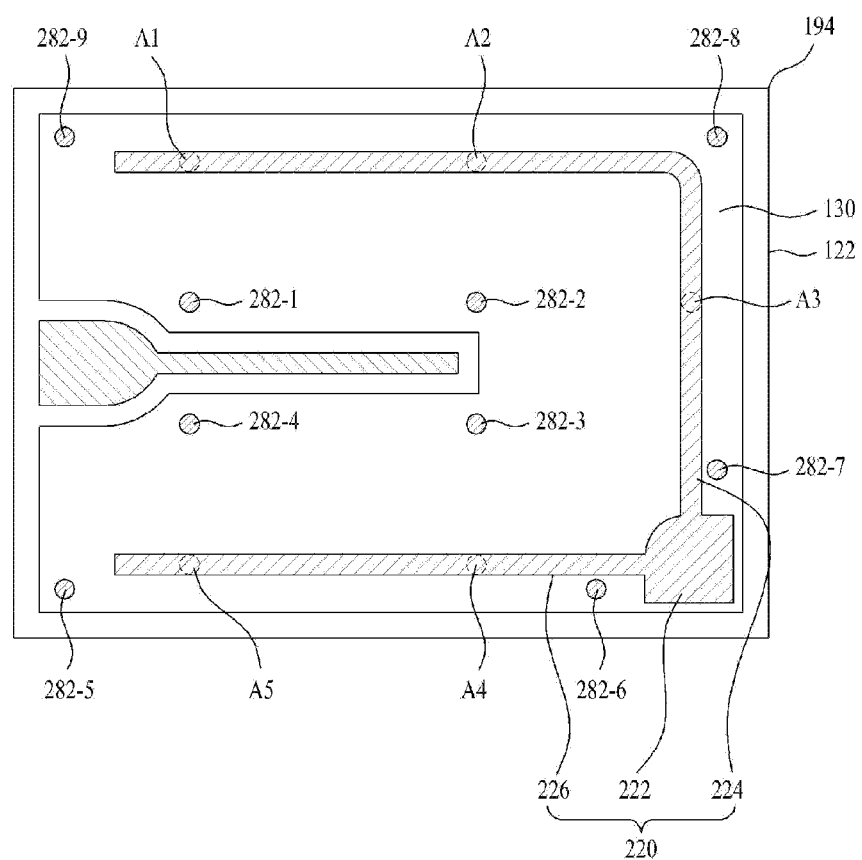
FIG. 12 illustrates bonding regions in which a first bonding layer of a first bonding portion shown in FIG. 10 is bonded to an extension electrode.

FIG. 12 illustrates bonding regions A1 to Am (in which m is a natural number of 1 or more) in which the first bonding layer 282-1 to 282-*n* (in which n is a natural number of 1 or more) of the first bonding portion (240-1 to 240-*n*) shown in FIG. 10 is bonded to extension electrodes 224 and 226 of a second bonding portion 230-1 to 230-*n* (in which n is a natural number of 1 or more).

Referring to FIG. 12, the first bonding layer 282-1 to 282-*n* (in which n is a natural number of 1 or more) may be formed on the conductive layer 130, and may have the same structure, material and shape as the first bonding layer 170-1 to 170-*n* (in which n is a natural number of 1 or more) described in FIG. 4.

The bonding region A1 to Am (in which m is a natural number of 1 or more) may be a portion of extension electrodes 224 and 226 to which the third bonding layer 286-1 to 286-*m* (in which m is a natural number of 1 or more) of the second bonding portion 230-1 to 230-*m* (in which m is a natural number of 1 or more) is bonded.

Figure 13:
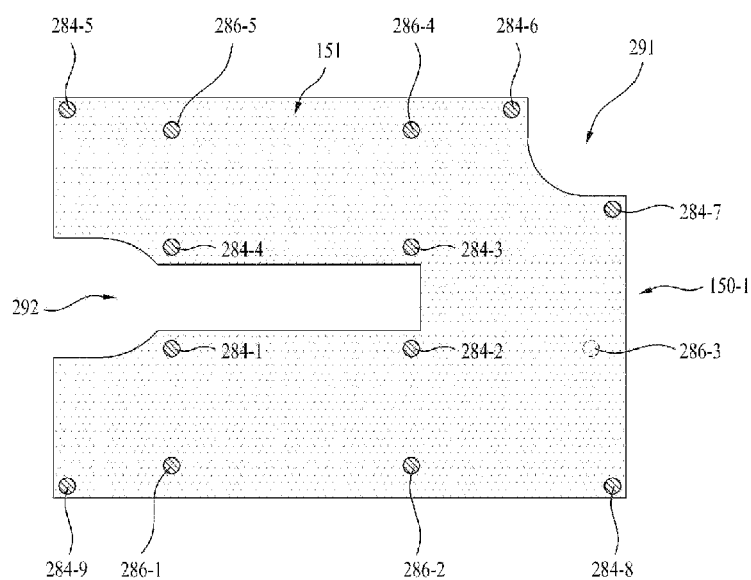
FIG. 13 illustrates a second bonding layer of the first bonding portion as shown in FIG. 10 and a third bonding layer of a second bonding portion.

FIG. 13 illustrates the second bonding layer 284-1 to 284-*n* (in which n is a natural number of 1 or more) of the first bonding portion 240-1 to 240-*n* (in which n is a natural number of 1 or more) as shown in FIG. 10 and the third bonding layer 286-1 to 286-*m* (in which m is a natural number of 1 or more) of the second bonding portion 230-1 to 230-*n* (in which n is a natural number of 1 or more).

Referring to FIG. 13, the second bonding layer 284-1 to 284-*n* (in which n is a natural number of 1 or more) may be disposed on a surface 151 of the phosphor plate 130. The second bonding layer 284-1 to 284-*n* (in which n is a natural number of 1 or more) may have the same structure, material and shape as the first bonding layer 180-1 to 180-*n* (in which n is a natural number of 1 or more) described in FIG. 5.

The phosphor plate 150-1 may have at least one opening 291 exposing the pad portion 222 of the second electrode 220 for wire bonding. In addition, the light emitting structure 120-1 may have a removed portion so as to expose the first electrode 210. The phosphor plate 150-1 may have an opening 292 which corresponds to the shape of one portion of the light emitting structure 120 exposing the first electrode 210.

Figure 14:
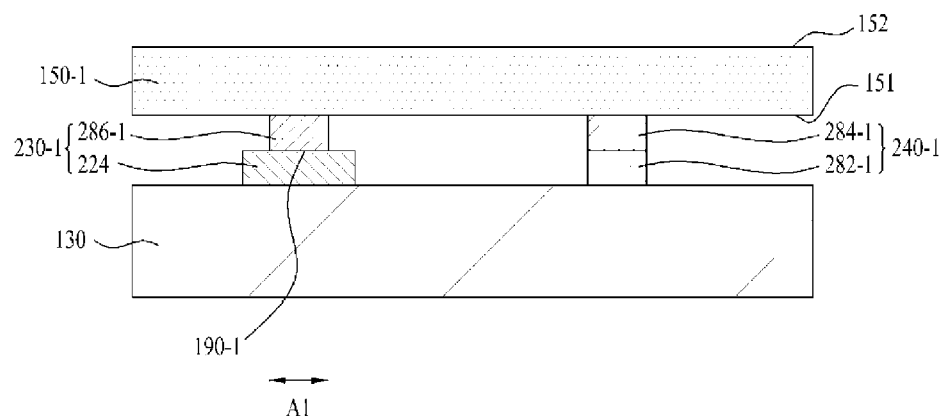
FIG. 14 is an enlarged view of a dotted line area 11 shown in FIG. 11.

FIG. 14 is an enlarged view of a dotted line area 11 shown in FIG. 11.

Referring to FIG. 14, the third bonding layer 286-1 to 286-*m* (in which m is a natural number of 1 or more) is spaced from the second bonding layer 284-1 to 284-*n* (in which n is a natural number of 1 or more), and is disposed on the surface 151 of the phosphor plate 130, such that it corresponds to or is arranged in the bonding region A1 to Am (in which m is a natural number of 1 or more).

The third bonding layer 286-1 to 286-*m* (in which m is a natural number of 1 or more) may be bonded to bonding regions A1 to Am (in which m is a natural number of 1 or more) of the extension electrodes 224 and 226.

The third bonding layer 286-1 to 286-*m* (in which m is a natural number of 1 or more) is disposed or arranged on the surface of the phosphor plate 150-1 such that it corresponds to the bonding region A1 to Am (in which m is a natural number of 1 or more).

One (for example, 286-1) of the third bonding layers 286-1 to 286-*m* (in which m is a natural number of 1 or more) may be bonded to one (for example, A1) of the corresponding bonding regions A1 to Am (in which m is a natural number of 1 or more).

The third bonding layer 286-1 to 286-*m* (in which m is a natural number of 1 or more) and the bonding region A1 to Am (in which m is a natural number of 1 or more) which are bonded to each other may constitute the second bonding portion 230-1 to 230-*m* (in which m is a natural number of 1 or more). The third bonding layer 286-1 to 286-*m* (in which m is a natural number of 1 or more) may be eutectic bonded to the bonding region A1 to Am (in which m is a natural number of 1 or more).

A width of the third bonding layer 286-1 to 286-*m* (in which m is a natural number of 1 or more) may be smaller than or equivalent to that of the extension electrode 224 or 226. This enables the third bonding layer 286-1 to 286-*m* (in which m is a natural number of 1 or more) to be easily bonded to the extension electrodes 224 and 226.

A fused interface 190-1 may be present between the third bonding layer 286-1 to 286-*m* (in which m is a natural number of 1 or more) and the bonding region A1 to Am (in which m is a natural number of 1 or more) of the extension electrodes 224 and 226.

Also, a melting point of the third bonding layer 286-1 to 286-*m* (in which m is a natural number of 1 or more) may be different from that of the second electrode 220, that is, melting point of the extension electrodes 224 and 226.

For example, the melting point of the third bonding layer 286-1 to 286-*m* (in which m is a natural number of 1 or more) may be lower than that of the second electrode 220, that is, the extension electrode 224 or 226. This enables the third bonding layer 286-1 to 286-*m* (in which m is a natural number of 1 or more) to be fused to the extension electrodes 224 and 226. When the melting points of the extension electrodes 224 and 226 are low, the extension electrodes 224 and 226 may be deformed during bonding by fusion, and current may not be smoothly supplied to the second semiconductor layer 126.

The second electrode 220 may be formed of the same material as described in FIG. 1 and the third bonding layer 286-1 to 286-*m* (in which m is a natural number of 1 or more) may be the same material as the second bonding layer 180-1 to 180-*n* (in which n is a natural number of 1 or more). For example, the second electrode 220 may contain Au and the third bonding layer 286-1 to 286-*m* (in which m is a natural number of 1 or more) may contain AuSn, but the disclosure is not limited thereto.

Aside from shape, the phosphor plate 150-1 is the same as the phosphor plate 150 shown in FIG. 5.

Figure 15:
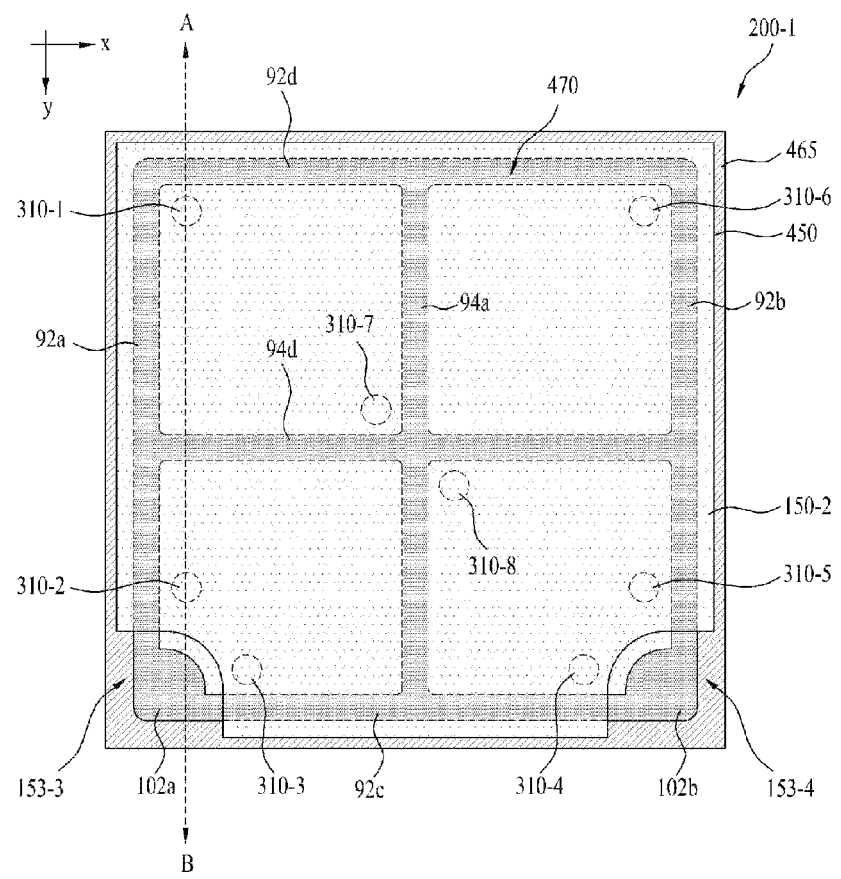
FIG. 15 is a plan view illustrating a light emitting device according to another embodiment.
Figure 16:
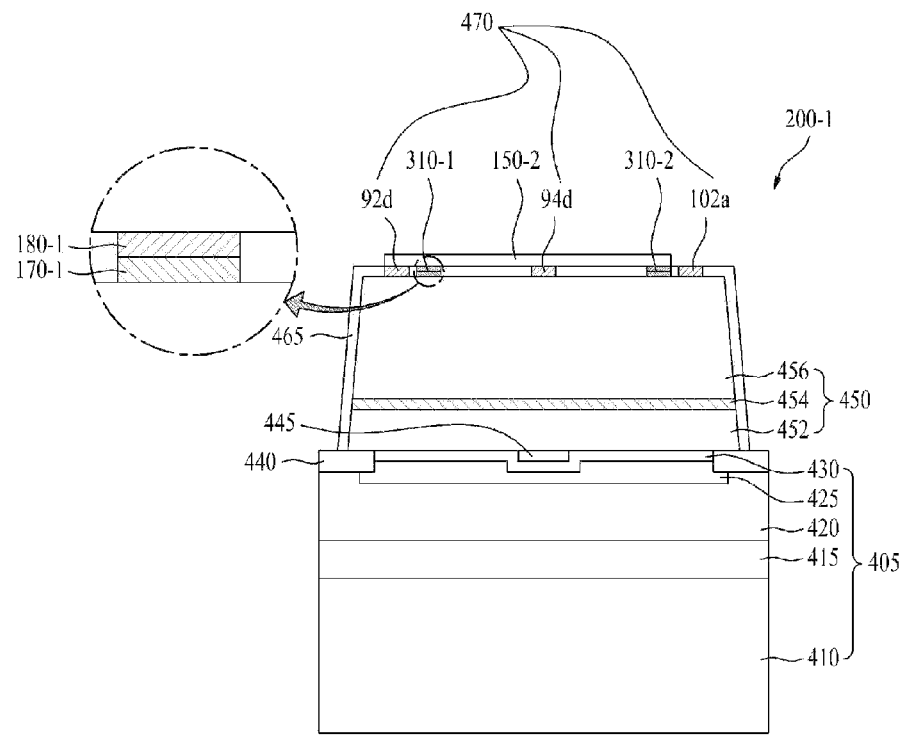
FIG. 16 is a sectional view taken along the direction AB of the light emitting device shown in FIG. 15.

FIG. 15 is a plan view illustrating a light emitting device 200-1 according to another embodiment. FIG. 16 is a sectional view taken along the direction AB of the light emitting device 200-1 shown in FIG. 15.

Referring to FIGS. 15 and 16, the light emitting device 200-1 includes a second electrode portion 405, a protective layer 440, a current blocking layer 445, a light emitting structure 450, a passivation layer 465, a first electrode portion 470, a first bonding portion 310-1 to 310-*n* (in which n is a natural number of 1 or more), and a phosphor plate 150-2.

The second electrode portion 405 supplies power to the light emitting structure 450, together with the first electrode portion 470. The second electrode portion 405 may include a support layer 410, a bonding layer 415, a barrier layer 420, a reflective layer 425, and an ohmic region 430.

The support layer 410 supports the light emitting structure 450. The support layer 410 may be formed of a metal or a semiconductor material. In addition, the support layer 410 may be formed of a material having high electrical conductivity. For example, the support layer 410 may be a metal material including at least one of copper (Cu), copper alloy (Cu alloy), gold (Au), nickel (Ni), molybdenum (Mo), and copper-tungsten (Cu—W), or a semiconductor including at least one of Si, Ge, GaAs, ZnO, and SiC.

The bonding layer 415 may be disposed between the support layer 410 and the barrier layer 420 and serve as a bonding layer to adhere the support layer 410 to the barrier layer 420. The bonding layer 415 may for example include at least one metal material of In, Sn, Ag, Nb, Pd, Ni, Au, and Cu. The bonding layer 415 is formed in order to adhere the support layer 410 by a bonding method. When the support layer 410 is formed by plating or deposition, the bonding layer 215 may be omitted.

The barrier layer 420 is disposed under the reflective layer 425, the ohmic area 430 and the protective layer 440 and prevents metal ions of the bonding layer 415 and the support layer 410 from passing through the reflective layer 425 and the ohmic area 430, and diffusing into the light emitting structure 450. For example, the barrier layer 420 may include at least one of Ni, Pt, Ti, W, V, Fe, and Mo and may have a single or multiple layer structure.

The reflective layer 425 may be disposed on the barrier layer 420 and reflect light emitted from the light emitting structure 450 to improve light extraction efficiency. The reflective layer 425 may be formed of a light-reflective material, for example, a metal including at least one of Ag, Ni, Al, Rh, Pd, Ir, Ru, Mg, Zn, Pt, Au, and Hf, or an alloy thereof.

The reflective layer 425 may have a multiple layer structure such as IZO/Ni, AZO/Ag, IZO/Ag/Ni, or AZO/Ag/Ni comprising a metal or an alloy, and a light-transmitting conductive material such as IZO, IZTO, IAZO, IGZO, IGTO, AZO and ATO.

The ohmic area 430 may be disposed between the reflective layer 425 and the second semiconductor layer 452 and ohmic-contacts the second semiconductor layer 452 to smoothly supply power to the light emitting structure 450.

The light-transmitting conductive layer and a metal may be selectively used for formation of the ohmic area 430. For example, the ohmic area 430 may include a metal material, for example, at least one of Ag, Ni, Cr, Ti, Pd, Ir, Sn, Ru, Pt, Au and Hf, which ohmic-contacts the second semiconductor layer 452.

The protective layer 440 may be disposed at an edge of the second electrode layer 405. For example, the protective layer 440 may be disposed at an edge of the ohmic area 430, an edge of the reflective layer 425, an edge of the barrier layer 420, or an edge of the support layer 410.

The protective layer 440 prevents deterioration in reliability of the light emitting device 300-2 caused by detachment of the interface between the light emitting structure 450 and the second electrode layer 405. The protective layer 440 may be formed of an electrical insulating material, for example, ZnO, $SiO_2$, $Si_3N_4$, $TiO_x$ (x represents a positive real number), or $Al_2O_3$.

The current blocking layer 445 may be disposed between the ohmic area 430 and the light emitting structure 450. An upper surface of the current blocking layer 445 contacts the second semiconductor layer 452 and a lower surface, or a lower surface and a side surface of the current blocking layer 445 may contact the ohmic area 430. At least part of the current blocking layer 445 may overlap the first electrode portion 470 in a vertical direction. The current blocking layer 445 is formed between the ohmic area 430 and the second semiconductor layer 452, or between the reflective layer 425 and the ohmic area 430, but the disclosure is not limited thereto.

The current blocking layer 445 may be a material having a lower electrical conductivity than the reflective layer 425 or the ohmic area 430, a material Schottky-contacting the second semiconductor layer 452, or an electrical insulating material. For example, the current blocking layer 445 may include at least one of ZnO, $SiO_2$, SiON, $Si_3N_4$, $Al_2O_3$, $TiO_2$ and AiN.

The light emitting structure 450 may be disposed on the ohmic area 430 and the protective layer 440. A side surface of the light emitting structure 450 may be an inclination surface during isolation etching to separate the resulting structure into unit chips.

The light emitting structure 450 may include a second semiconductor layer 452, an active layer 454 and a first semiconductor layer 456. The second semiconductor layer 452, the active layer 454 and the first semiconductor layer 456 are the same as described FIG. 1 and a detailed explanation thereof is omitted in order to avoid overlapping.

The passivation layer 465 may be disposed on a side surface of the light emitting structure 450 to electrically protect the light emitting structure 450. The passivation layer 465 may be disposed on a part of an upper surface of the first semiconductor layer 456 or an upper surface of the protective layer 440. The passivation layer 465 may be formed of an insulating material such as $SiO_2$, $SiO_x$, $SiO_xN_y$, $Si_3N_4$, or $Al_2O_3$.

The first electrode portion 470 may be disposed on the first semiconductor layer 456 and may have a predetermined pattern. The first semiconductor layer 456 may be provided on the upper surface thereof with a roughness pattern (not shown) to improve light extraction-efficiency. In addition, the first semiconductor layer 170 may be provided on the upper surface thereof with a roughness pattern (not shown) in order to improve light extraction efficiency.

The first electrode portion 470 may include a pad portion 102a or 102b to which a wire to supply power is bonded and an extension electrode portion 92a, 92b, 92c, 92d, 94a or 94b which branches from the pad portion 102a or 102b. A material for the first electrode portion 470 may include materials for the first electrode 142 and the second electrodes 144-1 and 144-2 described in FIG. 1.

For example, the first electrode portion 470 may be formed of at least one of Pb, Sn, Au, Ge, Bi, Cd, Zn, Ag, Ni, Ti, Cu, Al, 1r, 1n, Mg, Pt and Pd, or an alloy thereof.

The extension electrode portion 92a, 92b, 92c, 92d, 94a or 94b may include outer electrodes 92a, 92b, 92c and 92d disposed along an edge of a upper surface of the first semiconductor layer 456, and inner electrodes 94a and 94b disposed in the outer electrodes 92a, 92b, 92c and 92d.

The pad portion 102a or 102b may contact at least one of the outer electrodes or the inner electrodes. The pad portion 102a or 102b may be disposed between adjacent outer electrodes (for example, between 92a and 92c, or between 92b and 92c) and contact the adjacent outer electrodes 92a and 92c.

The outer electrodes 92a, 92b, 92c and 92d, the inner electrodes 94a and 94b, and the pad portion 102a or 102b shown in FIG. 15 are given only as an example of the first electrode portion 470, and the shape of the first electrode portion 470 is not limited thereto and may be variable.

The phosphor plate 150-2 may be disposed on the first semiconductor layer 456. Aside from shape, the phosphor plate 150-2 is the same as the phosphor plate 150 shown in FIG. 5. The phosphor plate 150-2 may have an opening 153-3 or 153-4 to expose the pad portion 102a or 102b.

The first bonding portion 310-1 to 310-n (in which n is a natural number of 1 or more) may be interposed between the first semiconductor layer 456 and the phosphor plate 150-2, and bond the phosphor plate 150-2 to the first semiconductor layer 456.

The first bonding portion 310-1 to 310-n (in which n is a natural number of 1 or more) may include a first bonding layer 170-1 to 170-n (in which n is a natural number of 1 or more) formed on the first semiconductor layer 456 and a second bonding layer 180-1 to 180-n (in which n is a natural number of 1 or more) formed on a surface 151 of the phosphor plate 150-2.

The second bonding layer 180-1 to 180-n (n is a natural number of 1 or more) may be fused to the first bonding layer 170-1 to 170-n (in which n is a natural number of 1 or more). The first bonding layer (for example, 170-1) and the second bonding layer (for example, 180-1) of the first bonding portion 310-1 to 310-n (in which n is a natural number of 1 or more) shown in FIG. 16 are the same as described in FIGS. 8 and 9.

An air void may be present between the phosphor plate 150-2 and the first semiconductor layer 456 by the first bonding portion 310-1 to 310-n (in which n is a natural number of 1 or more). Although the air void is present, at least one portion of one surface of the phosphor plate 150-2 may contact the first semiconductor layer 456.

Figure 17:
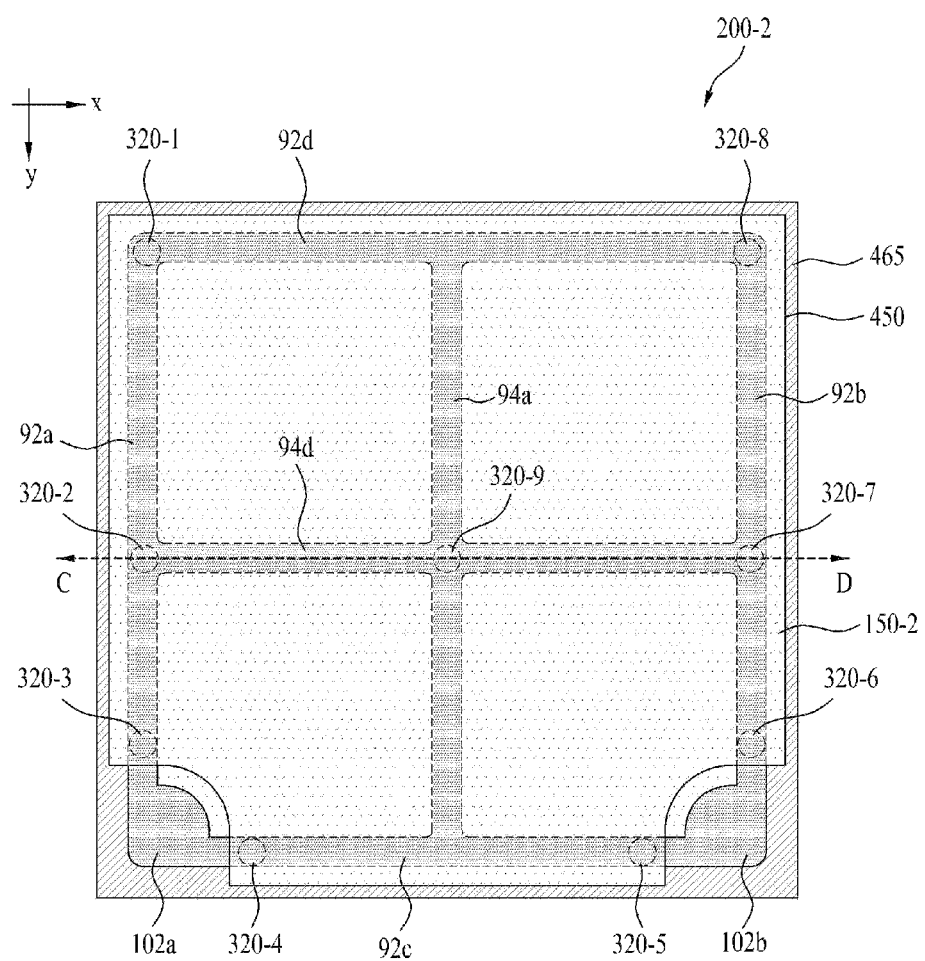
FIG. 17 is a sectional view illustrating a varied embodiment of the light emitting device shown in FIG. 15.
Figure 18:
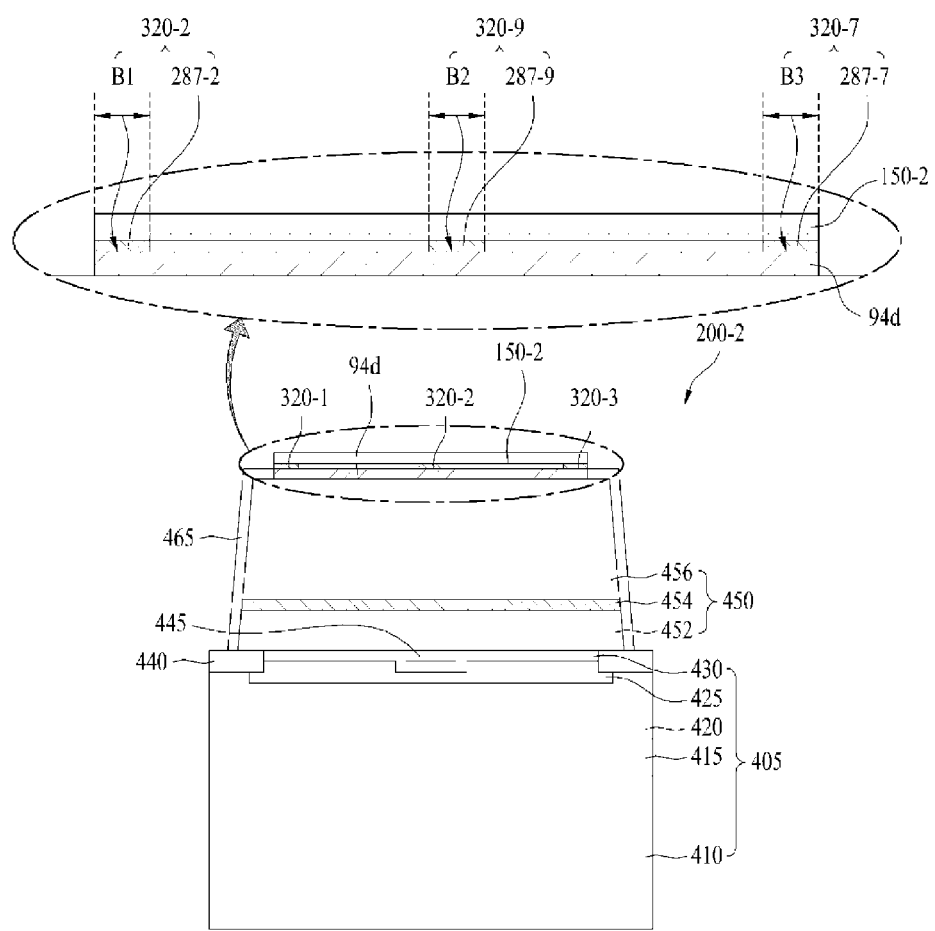
FIG. 18 is a sectional view illustrating the direction CD of the varied embodiment of the light emitting device shown in FIG. 17.

FIG. 17 is a sectional view illustrating a varied embodiment of a light emitting device 200-2 shown in FIG. 15. FIG. 18 is a sectional view illustrating the direction CD of the varied embodiment of the light emitting device 200-2 shown in FIG. 17. Identical reference numerals represent like configurations throughout FIGS. 15 and 16 and the contents described above are omitted or described in brief.

Referring to FIGS. 17 and 18, the light emitting device 200-2 according to the varied embodiment may include a second bonding portion 320-1 to 320-n (in which n is a natural number of 1 or more), instead of the first bonding portion 310-1 to 310-n (in which n is a natural number of 1 or more) shown in FIGS. 15 and 16.

The second bonding portion 320-1 to 320-n (in which n is a natural number of 1 or more) is interposed between the first electrode portion 470 and the phosphor plate 150-2 and bonds the phosphor plate 150-2 to the first electrode portion 470.

A third bonding layer 287-1 to 287-n (in which n is a natural number of 1 or more) may be formed on a surface 151 of the phosphor plate 150-2. The third bonding layer 287-1 to 287-n (in which n is a natural number of 1 or more) may be the same as the third bonding layer 284-1 to 284-m (in which m is a natural number of 1 or more) described in FIGS. 13 and 14.

The third bonding layer 287-1 to 287-n (in which n is a natural number of 1 or more) may be bonded to a portion of the first electrode portion 470. That is, the third bonding layer 287-1 to 287-n (in which n is a natural number of 1 or more) may be bonded to a portion of the extension electrode portion 92a, 92b, 92c, 92d, 94a or 94b. The portion of the extension electrode portion 92a, 92b, 92c, 92d, 94a or 94b, to which the third bonding layer 287-1 to 287-n (in which n is a natural number of 1 or more) is bonded, is referred to as a "bonding region" B1 to Bn (in which n is a natural number of 1 or more).

The third bonding layer 287-1 to 287-n (in which n is a natural number of 1 or more) may be bonded to the bonding region B1 to Bn (in which n is a natural number of 1 or more) of each of the outer electrodes 92a, 92b, 92c and 92d, and the inner electrodes 94a and 94b of the first electrode portion 470.

The bonding region B1 to Bn (in which n is a natural number of 1 or more) of the first electrode portion 470 and the third bonding layer 286-1 to 286-m (in which m is a natural number of 1 or more) bonded thereto may constitute the second bonding portion 320-1 to 320-n (in which n is a natural number of 1 or more).

A width of the third bonding layer 287-1 to 287-n (in which n is a natural number of 1 or more) may be smaller than or equivalent to that of the outer electrode 92a, 92b, 92c or 92d) and the inner electrode 94a or 94b. In addition, a melting point of the third bonding layer 287-1 to 287-n (in which n is a natural number of 1 or more) may be different from that of the first electrode portion 470. For example, a melting point of the third bonding layer 287-1 to 287-n (in which n is a natural number of 1 or more) may be lower than that of the first electrode portion 470.

An air void may be present between the phosphor plate 150-2 and the first semiconductor layer 456 by the second bonding portion 320-1 to 320-n (in which n is a natural number of 1 or more). Although the air void is present, a portion of one side of the lower surface 150-2 may contact the first semiconductor layer 456.

Figure 19:
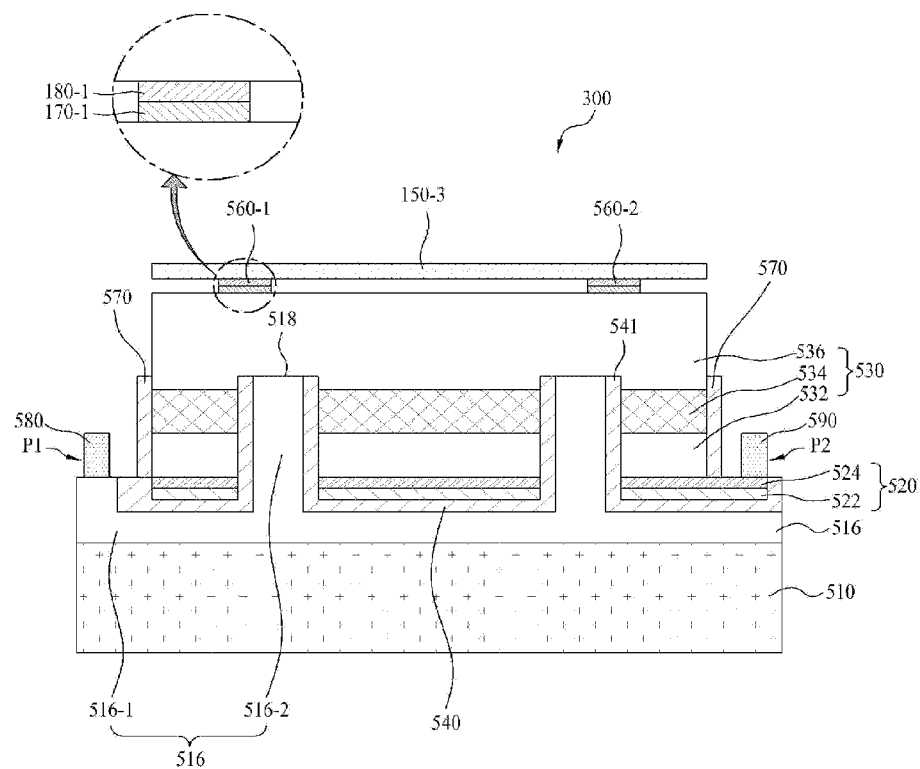
FIG. 19 is a sectional view illustrating a light emitting device according to another embodiment.

FIG. 19 is a sectional view illustrating a light emitting device 300 according to another embodiment.

Referring to FIG. 19, the light emitting device 300 includes a light emitting structure 530, a second electrode portion 520, a first electrode portion 516, a support substrate 510, an insulating layer 540, a protective layer 570, a first electrode pad 580, a second electrode pad 590, a phosphor plate 150-3, and at least one bonding portion 560-1 to 560-n (in which n is a natural number of 1 or more)

The light emitting structure 530 includes a second semiconductor layer 532, an active layer 534 and a first semiconductor layer 536 and the structure thereof may be the same as described in FIG. 1.

The second electrode portion 520 is disposed under the light emitting structure 530, for example, the second semiconductor layer 532, and contacts the second semiconductor layer 532. The second electrode portion 520 may have a laminate structure of an ohmic layer/reflective layer/bonding layer, a laminate structure of ohmic layer/reflective layer, or a laminate structure of reflective layer (including ohmic region)/bonding layer, but the disclosure is not limited thereto. For example, the second electrode portion 520 may have a laminate structure which includes a reflective layer 522 and an ohmic layer 524 sequentially laminated on the insulating layer 540.

The first electrode portion 516 is disposed under the second electrode portion 520 and passes through the second electrode portion 520, the second semiconductor layer 532 and the active layer 534 and contacts the first semiconductor layer 536.

The first electrode portion 516 may include a lower electrode layer 516-1 and a contact electrode 516-2. The lower electrode layer 516-1 may be disposed under the second electrode portion 520. For example, the lower electrode layer 516-1 is disposed between the support substrate 510 and the second electrode portion 520, contacts the support substrate 510 and is horizontal to the support substrate 510.

The contact electrode 516-2 branches or extends from the lower electrode layer 516-1 in a vertical direction, passes through the second electrode portion 520, the second semiconductor layer 532 and the active layer 534, and contacts the first semiconductor layer 536. An upper surface of the contact electrode 516-2 is higher than that of the active layer 534 and is lower than that of the first semiconductor layer 536.

The first electrode portion 516 may include at least one of a reflective layer and a bonding layer. The first electrode portion 516 may have an ohmic region 518 which ohmic-contacts the first semiconductor layer 536 using a reflective metal or conductive oxide.

The insulating layer 540 insulates the first electrode portion 516 from other layers 520, 532 and 534. The insulating layer 540 may be disposed between the second electrode portion 520 and the first electrode portion 516, between the second semiconductor layer 532 and the first electrode portion 516, and between the active layer 534 and the first electrode portion 516.

The insulating layer 540 is disposed between the lower electrode layer 516-1 and the reflective layer 522 to electrically isolate the lower electrode layer 516-1 from the reflective layer 522. In addition, a portion 541 of the insulating layer 540 is disposed between the contact electrode 516-2 and the second electrode portion 520, between the contact electrode 516-2 and the second semiconductor layer 532, and between the contact electrode 516-2 and the active layer 534 to electrically isolate the contact electrode 516-2 from the other layers 520, 532 and 534. In addition, the insulating layer 540 may be disposed between the contact electrode 516-2 and the first semiconductor layer 536.

The support substrate 510 may be disposed under the first electrode portion 516. The support substrate 510 may be a conductive substrate or an insulating substrate and support the light emitting structure 530.

For example, the support substrate 510 may be a base substrate having a predetermined thickness and include at least one of copper (Cu), gold (Au), nickel (Ni), molybdenum (Mo), copper-tungsten (Cu—W), a carrier wafer (for example, Si, Ge, GaAs, ZnO, or SiC), and a conductive sheet.

A side of the first electrode portion 516, for example, a side of the lower electrode layer 516-1 may be exposed from the light emitting structure 530 to the outside. The first electrode pad 580 may be disposed a side portion P1 of the first electrode portion 516. The first electrode pad 580 may include one or more first electrode pads spaced from one another.

A side portion of the second electrode portion 520, for example, a side portion of the ohmic layer 524 and/or the reflective layer 522, may be exposed from the light emitting structure 530 and the second electrode pad 590 may be disposed in a side portion P2 of the second electrode portion 520. The side portion P2 of the second electrode portion 520 may be an edge of the second electrode portion 520.

The number of the side portion P2 of the exposed second electrode portion 520 may one or more and include a plurality of second electrode pads 590. The first electrode pad 580 and the second electrode pad 580 may not overlap the light emitting structure 530 in a vertical direction.

The protective layer 570 may be disposed such that it surrounds a side of the light emitting structure 520. The protective layer 570 may cover at least side surfaces of the second semiconductor layer 532 and the active layer 534.

For example, the protective layer 570 may be disposed on the side portion P1 of the exposed first electrode portion 516, a side of the second semiconductor layer 532 adjacent to the side portion P2 of the exposed second electrode portion 520, a side of the active layer 534, and a partial side of the first semiconductor layer 536.

In addition, the protective layer 570 may be disposed at an edge of the upper surface of the first semiconductor layer 536 adjacent to the side of the light emitting structure 53, but the disclosure is not limited thereto. The protective layer 570 prevents electric short circuit between the first and second electrode pads 180 and 190 and the light emitting structure 130.

The phosphor plate 150-3 is disposed on the first semiconductor layer 536, and the bonding portion 560-1 to 560-n (in which n is a natural number of 1 or more) is interposed between the phosphor plate 150-3 and the first semiconductor layer 536 and adheres the phosphor plate 150-3 to the light emitting structure 530.

Aside from the shape, the phosphor plate 150-3 is the same as the phosphor plate 150 shown in FIG. 5. For example, in the present embodiment, the electrode pad 580 or 590 to which a wire is bonded is not disposed between the phosphor plate 150-3 and the light emitting structure 530. Accordingly, the phosphor plate 150-3 may not have an opening to expose electrode pads 580 and 590 for wire bonding.

The bonding portion 560-1 to 560-n (in which n is a natural number of 1 or more) may include a first bonding layer 170-1 to 170-n (in which n is a natural number of 1 or more) formed on the first semiconductor layer 536 and a second bonding layer 180-1 to 180-n (in which n is a natural number of 1 or more) formed on a surface 151 of the phosphor plate 150-3. The first bonding layer (for example, 170-1) and the second bonding layer (for example, 180-1) shown in FIG. 19 may be the same as those described in FIGS. 8 and 9.

The first bonding layer (for example, 170-1) and the second bonding layer (for example, 180-1) are spaced from the first electrode pad 580 and the second electrode pad 590, and are electrically isolated from each other.

Figure 20:
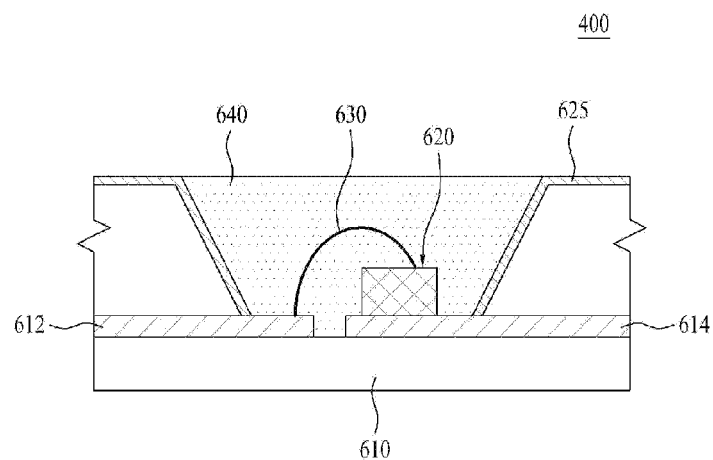
FIG. 20 illustrates a light emitting device package according to one embodiment.

FIG. 20 illustrates a light emitting device package 400 according to an embodiment.

Referring to FIG. 20, the light emitting device package 400 includes a package body 610, lead frames 612 and 614, a light emitting device 620, a reflective plate 625, a wire 630 and a resin layer 640.

The package body 610 may be provided at an upper surface thereof with a cavity. A side wall of the cavity may be inclined. The package body 610 shown in FIG. 20 has a cavity, but the disclosure is not limited thereto. In another embodiment, the package body may not have a cavity.

The package body 610 has a structure with a cavity at one side region thereof. Here, the side wall of the cavity may be inclined. The package body 610 may be formed of a substrate having excellent insulation and thermal conductivity, such as a silicon-based wafer level package, a silicon substrate, silicon carbide (SiC), aluminum nitride (A1N) or the like, and may have a structure in which plural substrates are stacked. The disclosure is not limited to the above-described material, structure and shape of the package body 610.

The first lead frame 612 and the second lead frame 614 are disposed on the surface of the package body 610 so as to be electrically separated from each other in consideration of heat discharge or mounting of the light emitting device 620.

The light emitting device 620 is disposed on the second lead frame 612 and is electrically connected to the first lead frame 612 and the second lead frame 614. Here, the light emitting device 620 may be one of the light emitting devices according to the embodiments 100-1, 100-2, 200-1, 200-2 and 300.

The reflective plate 625 may be formed on the side wall of the cavity of the package body 610 to guide light emitted from the light emitting device 620 in a designated direction. The reflective plate 625 may be formed of a light reflective material, for example, a metal coating or metal flakes.

The resin layer 640 surrounds the light emitting device 620 located within the cavity of the package body 610, and protects the light emitting device 620 from an external environment. The resin layer 640 may be formed of a colorless transparent polymer resin material, such as epoxy or silicone.

Figure 21:
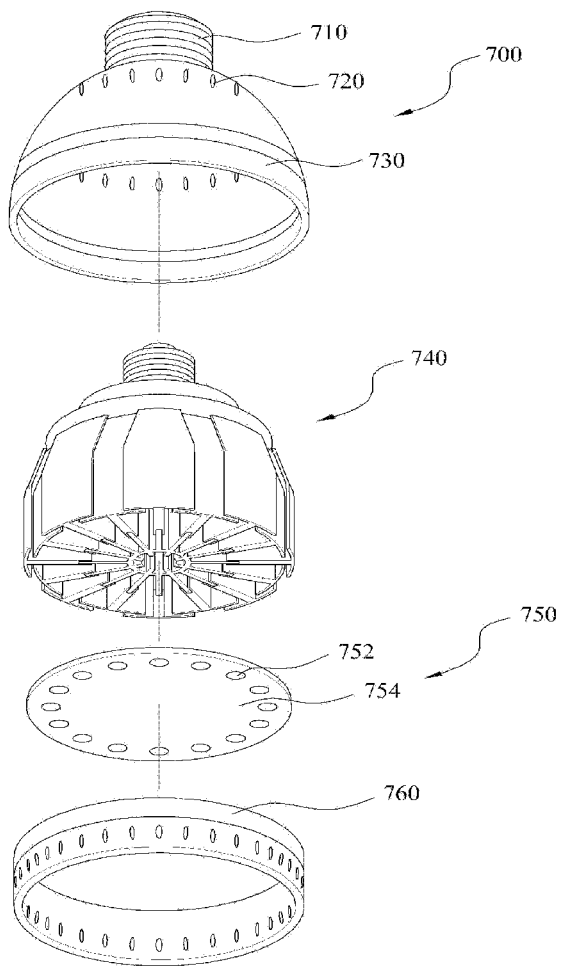
FIG. 21 is an exploded perspective view illustrating a lighting device including the light emitting device package according to one embodiment.

Since the light emitting device 620 according to the embodiment includes phosphor plates 150, and 150-1 to 150-3, the resin layer 640 may not include a phosphor. However, in another embodiment, the resin layer 640 may include phosphors which are the same as or differ from phosphors contained in the phosphor plate. FIG. 21 is an exploded perspective view illustrating a lighting device including the light emitting device package according to one embodiment. Referring to FIG. 21, the lighting device includes a light source 750, a radiator 740 to emit heat of the light source 750, a housing 700 including the light source 750 and the radiator 740, and a holder 760 to connect the light source 750 and the radiator 740 to the housing 700.

The housing 700 includes a socket connector 710 bonded to an electric socket (not shown) and a body member 730 connected to the socket connector 710 wherein the body member 730 includes a light source 750. The body member 730 may be provided with an air passage hole 720.

The body member 730 of the housing 700 is provided on the surface thereof with a plurality of air passage holes 720. The number of the air passage holes 720 may be one or more. The passage holes 720 may be radially arranged on the body member 730 or have other arrangements.

The light source 750 includes a substrate 754 and a plurality of the light emitting device packages 752 arranged thereon. The substrate 754 has a shape which may be inserted into an opening of the housing 700 and is made of a material having high thermal conductivity to transfer heat to the radiator 740. For example, the light emitting device package 752 is the light emitting device package 400 according to the embodiment shown in FIG. 20.

The holder 760 may be provided under the light source and include a frame and another air passage hole. In addition, although not shown, optical members are provided under the light source 750 to diffuse, scatter or converge light projected by the light emitting device package 150 of the light source 750.

Figure 22:
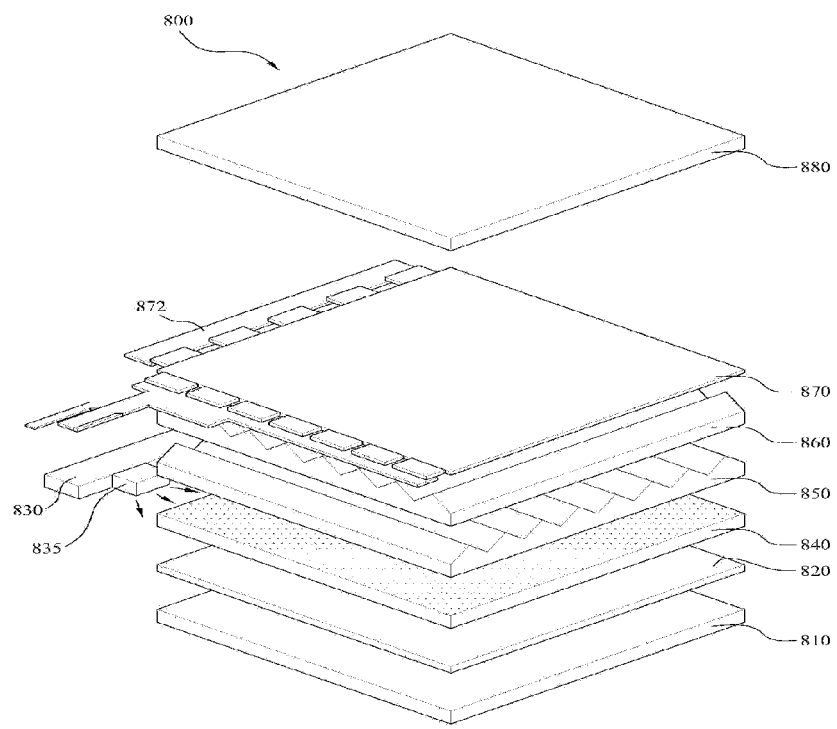
FIG. 22 is a view illustrating a display device including the light emitting device packages according to one embodiment.

FIG. 22 is a view illustrating a display device including the light emitting device packages according to one embodiment. Referring to FIG. 22, the display device 800 according to this embodiment includes a bottom cover 810, a reflective plate 820 disposed on the bottom cover 810, light emitting modules 830 and 835 to emit light, a light guide plate 840 arranged in front of the reflective plate 820 to direct light emitted from the light emitting module toward the front of the display device, an optical sheet including prism sheets 850 and 860 arranged in front of the light guide plate 840, a display panel 870 arranged in front of the optical sheet, an image signal output circuit connected to the display panel 870 and supplying an image signal to the display panel 870, and a color filter 880 arranged in front of the display panel 870. The bottom cover 810, the reflective plate 820, the light emitting modules 830 and 835, the light guide plate 840 and the optical sheet may constitute a backlight unit.

The light emitting module includes light emitting device packages 835 mounted on the circuit substrate 830. The circuit substrate 830 may be a PCB or the like and the light emitting device package 835 is the same as the light emitting device package according to the embodiment illustrated in FIG. 20.

The bottom cover 810 may accommodate constituent components of the display device 800. The reflective plate 820 may be provided as a separate element, as illustrated in the drawing, or may be coated with a material having a high reflectivity provided on the back surface of the light guide plate 840 or the front surface of the bottom cover 810.

Here, the reflective plate 820 may be made of a highly reflective material capable of functioning in an ultra-thin film form and examples thereof include polyethylene terephthalate (PET).

In addition, the light guide plate 840 may be formed of polymethylmethacrylate (PMMA), polycarbonate (PC) or polyethylene (PE).

The first prism sheet 850 is formed at a side of the support film using a light-transmitting and elastic polymer and the polymer may include a prism layer having a plurality of repeatedly formed three-dimensional structures. Here, the plurality of patterns, as illustrated in the drawing, may be provided as stripe patterns in which protrusions and grooves repeatedly alternate.

A direction of the protrusions and grooves arranged on one side of the support film in the second prism sheet 860 may be vertical to a direction of the protrusions and grooves arranged on one side of the support film in the first prism sheet 850 so that light transferred from the light emitting module and the reflective plate can be uniformly distributed in all directions of the display panel 870.

Although not shown, a diffusion sheet may be disposed between the light guide plate 840 and the first prism sheet 850. The diffusion sheet may be made of a polyester or polycarbonate material and maximizes a projection angle of light incident from the backlight unit through refraction and scattering. Also, the diffusion sheet includes a support layer containing a light diffuser, and a first layer and a second layer which are formed on a light emission surface (first prism sheet direction) and a light incident surface (reflection sheet direction) and do not contain a light diffuser.

In this embodiment, the first prism sheet 850 and the second prism sheet 860 constitute an optical sheet and the optical sheet may be for example provided as a micro lens array, a combination of one or more diffusion sheets and a micro lens array, or a combination of one prism sheet and a micro lens array.

The display panel 870 may be a liquid crystal panel and other display devices requiring a light source may be arranged, in addition to the liquid crystal panel 860.

Figure 23:
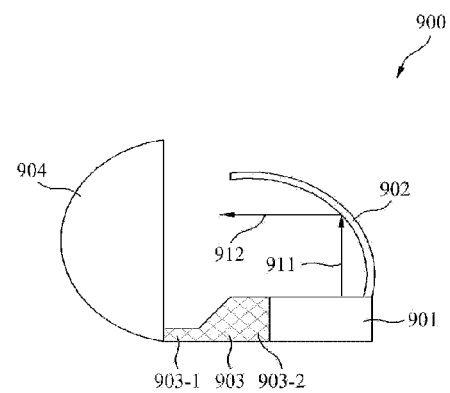
FIG. 23 illustrates a head lamp including the light emitting device package according to one embodiment.

FIG. 23 illustrates a head lamp 900 including the light emitting device package according to the embodiment. Referring to FIG. 23, the head lamp 900 includes a light emitting module 901, a reflector 902, a shade 903 and a lens 904.

The light emitting module 901 may include a light emitting device package 400 according to one embodiment disposed a substrate (not shown). The reflector 902 may reflect light 911 irradiated from the light emitting module 901 in a predetermined direction, for example, a front direction 912.

The shade 903 is a member which is disposed between the reflector 902 and the lens 904 and blocks or reflects a part of light which is reflected from the reflector 902 and directs toward the lens 904 to form a light distribution pattern satisfying a designer's intention. A height of one side 903-1 of the shade 903 may be different from that of other side 903-2 thereof.

The light irradiated from the light emitting module 901 is reflected on the reflector 902 and the shade 903, passes through the lens 904 and extends toward the front of a body. The lens 904 refracts light reflected by the reflector 902 in the front direction.

As is apparent from the above description, the embodiments provide a light emitting device to improve adhesion accuracy of phosphor plates and prevent discoloration and cracks of the phosphor plates caused by heat.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure comprising a first semiconductor layer, an active layer and a second semiconductor layer;
   a pad disposed on the second semiconductor layer;
   an extension electrode extending from the pad and being disposed on the second semiconductor layer;
   a phosphor plate disposed on the second semiconductor layer;
   a first bonding portion disposed between the light emitting structure and the phosphor plate, the first bonding portion bonding the phosphor plate to the light emitting structure; and
   a second bonding portion between the extension electrode and the phosphor plate,
   wherein the first bonding portion is spaced away from the second bonding portion, and the phosphor plate has an opening exposing the pad.

2. The light emitting device according to claim 1, wherein the first bonding portion comprises:
   a first bonding layer disposed on the second semiconductor layer; and
   a second bonding layer disposed on a surface of the phosphor plate and being bonded to the first bonding layer.

3. The light emitting device according to claim 2, wherein the second bonding layer is fused to the first bonding layer.

4. The light emitting device according to claim 3, wherein a fused interface is present between the first bonding layer and the second bonding layer.

5. The light emitting device according to claim 2, wherein a melting point of the second bonding layer is different from a melting point of the first bonding layer.

6. The light emitting device according to claim 2, wherein the first bonding layer and the second bonding layer comprise a plurality of first bonding layers and a plurality of second bonding layers, respectively, the first bonding layers and the second bonding layers are disposed such that the first bonding layers correspond to the second bonding layers, respectively, and one of the second bonding layers is bonded to one of the first bonding layers.

7. The light emitting device according to claim 4, wherein the first bonding layer and the second bonding layer comprise at least one of Ag, Ni, Cr, Ti, Al, Rh, Pd, Sn, Ru, Mg, Zn, Pt and Au, or an alloy containing the same.

8. The light emitting device according to claim 1, wherein the extension electrode is disposed between the second semiconductor layer and the phosphor plate, and the opening exposes a part of the extension electrode adjacent to the pad.

9. The light emitting device according to claim 1, wherein an air void is present between the phosphor plate and the light emitting structure.

10. The light emitting device according to claim 2, further comprising:
    a substrate disposed under the first semiconductor layer;
    a first electrode disposed on an exposed part of the first semiconductor layer; and
    a conductive layer disposed on the second semiconductor layer,
    wherein the first bonding layer is disposed on the conductive layer.

11. The light emitting device according to claim 1, wherein the first bonding portion is electrically isolated from the pad.

12. A light emitting device comprising:
    a light emitting structure comprising a first semiconductor layer, an active layer and a second semiconductor layer;
    a pad disposed on the second semiconductor layer;
    an extension electrode extending from the pad and being disposed on the second semiconductor layer;
    a phosphor plate disposed on the second semiconductor layer;
    a first bonding portion disposed between the light emitting structure and the phosphor plate, the first bonding portion bonding the phosphor plate to the light emitting structure; and
    a second bonding portion between the extension electrode and the phosphor plate,
    wherein the phosphor exposing the pad and the second bonding portion comprises a third bonding layer disposed on a surface of the phosphor plate and bonded to the extension electrode portion.

13. The light emitting device according to claim 12, wherein a fused interface is present between the extension electrode and the third bonding layer.

14. The light emitting device according to claim 12, wherein a melting point of the third bonding layer is different from a melting point of the extension electrode.

15. The light emitting device according to claim 12, wherein a width of the third bonding layer is smaller than or equivalent to a width of the extension electrode.

16. The light emitting device according to claim 1, wherein the second bonding portion comprises a third bonding layer disposed on a surface of the phosphor plate and bonded to the extension electrode.

17. The light emitting device according to claim 16, wherein a melting point of the third bonding layer is different from a melting point of the extension electrode.

18. The light emitting device according to claim 16, wherein a width of the third bonding layer is smaller than or equivalent to a width of the third extension electrode.

19. The light emitting device according to claim 16, wherein a fused interface is present between the extension electrode and the third bonding layer.

* * * * *